United States Patent
Liu et al.

(10) Patent No.: US 12,538,626 B2
(45) Date of Patent: Jan. 27, 2026

(54) LIGHT-EMITTING MODULE AND DISPLAY APPARATUS

(71) Applicant: Xiamen Tianma Micro-Electronics Co., Ltd., Xiamen (CN)

(72) Inventors: Bingping Liu, Xiamen (CN); Junyi Li, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 633 days.

(21) Appl. No.: 17/706,727

(22) Filed: Mar. 29, 2022

(65) Prior Publication Data

US 2022/0216265 A1 Jul. 7, 2022

(30) Foreign Application Priority Data

Dec. 31, 2021 (CN) .......................... 202111664607.6

(51) Int. Cl.
*H10H 29/14* (2025.01)
*G02F 1/13357* (2006.01)
(Continued)

(52) U.S. Cl.
CPC ..... *H10H 29/142* (2025.01); *G02F 1/133603* (2013.01); *G09G 3/32* (2013.01);
(Continued)

(58) Field of Classification Search
CPC ........... G02F 1/133603; G02F 1/13336; G02F 1/13454; G09G 3/32; G09G 2300/026;
(Continued)

(56) References Cited

U.S. PATENT DOCUMENTS

2014/0183472 A1* 7/2014 Kim ..................... H10K 59/124
438/34
2021/0041624 A1* 2/2021 Niwa ................... G02B 6/0078
(Continued)

FOREIGN PATENT DOCUMENTS

CN 101673509 A 3/2010
CN 208225917 U 12/2018
(Continued)

OTHER PUBLICATIONS

Chinese Office Action mailed Apr. 13, 2024, issued in related Chinese Application No. 202111664607.6 filed Dec. 31, 2021, 12 pages.

*Primary Examiner* — Amr A Awad
*Assistant Examiner* — Aaron Midkiff
(74) *Attorney, Agent, or Firm* — Christensen O'Connor Johnson Kindness PLLC

(57) ABSTRACT

A light-emitting module and a display apparatus are provided. The light-emitting module includes a drive substrate including a substrate and a drive layer located at a side of the substrate, cell structures arranged in an array of m rows and n columns and located at a side of the drive layer facing away from the substrate, and drive chips. The drive layer includes thin film transistors, and the substrate is an integral structure. Both m and n are positive integers and m and n are not both 1. The cell structures each include light-emitting devices, and the cell structures are driven independently from each other. One of the cell structures corresponds to at least one of the drive chips.

17 Claims, 18 Drawing Sheets

(51) Int. Cl.
 *G09G 3/32* (2016.01)
 *H10H 20/857* (2025.01)
(52) U.S. Cl.
 CPC ... *H10H 20/857* (2025.01); *G09G 2310/0267* (2013.01); *G09G 2310/0286* (2013.01)
(58) Field of Classification Search
 CPC ... G09G 2300/0408; G09G 2310/0267; G09G 2310/0286; G09G 3/3266; G09G 2300/08–0895; G11C 19/28–287; H01L 25/0753; H01L 25/167; H01L 27/156; H01L 33/62; H01L 25/072; H01L 2924/12041; G06F 3/1446; G09F 9/3023; G09F 9/3026; H10H 20/857; H10H 29/142; H10K 59/70; H10K 2102/3026
 See application file for complete search history.

(56) References Cited

U.S. PATENT DOCUMENTS

| | | | |
|---|---|---|---|
| 2021/0366378 A1* | 11/2021 | Zhao | G09G 3/3233 |
| 2021/0375197 A1* | 12/2021 | Dai | G09G 3/32 |
| 2022/0123045 A1* | 4/2022 | Cho | G09G 3/3266 |
| 2022/0149112 A1* | 5/2022 | Hwang | G09F 9/302 |
| 2022/0165216 A1* | 5/2022 | Hong | H10K 59/131 |
| 2022/0284849 A1* | 9/2022 | Shin | G11C 19/28 |
| 2022/0343862 A1* | 10/2022 | Cheng | H10K 59/131 |

FOREIGN PATENT DOCUMENTS

| | | | | |
|---|---|---|---|---|
| CN | 111627342 A | | 9/2020 | |
| KR | 20220070124 A | * | 5/2022 | ........... G09G 3/3233 |
| WO | 2021102810 A1 | | 6/2021 | |

* cited by examiner

LIGHT-EMITTING MODULE AND DISPLAY APPARATUS

CROSS-REFERENCE TO RELATED APPLICATIONS

The present application claims priority to Chinese Patent Application No. 202111664607.6, filed on Dec. 31, 2021, the content of which is incorporated herein by reference in its entirety.

TECHNICAL FIELD

The present disclosure relates to the technical field of display, and in particular, to a light-emitting module and a display apparatus.

BACKGROUND

Currently, display technologies such as normal liquid crystal display (LCD), mini light-emitting diode (LED), and organic light-emitting diode (OLED) are widely used in the display field. The mini LED has a better contrast than the normal LCD, and is superior to the OLED in terms of service life and price, such that there is increasing market demand for mini LED.

The mini LED can be used as a backlight or display panel for large-screen display. The mini LED in in the related art for large-screen applications takes a printed circuit board (PCB) as the base and uses Cu as the drive metal trace. The base of the LED has a feature of high cost.

SUMMARY

According to a first aspect, an embodiment of the present disclosure provides a light-emitting module. The light-emitting module includes a drive substrate including a substrate and a drive layer located at a side of the substrate, cell structures arranged in an array of m rows and n columns and located at a side of the drive layer facing away from the substrate, and drive chips. The drive layer includes thin film transistors, and the substrate is an integral structure. Both m and n are positive integers and m and n are not both 1. The cell structures each include light-emitting devices, and the cell structures are driven independently from each other. One of the cell structures corresponds to at least one of the drive chips.

According to a second aspect, an embodiment of the present disclosure provides a display apparatus, including a light-emitting module. The light-emitting module includes a drive substrate including a substrate and a drive layer located at a side of the substrate, cell structures arranged in an array of m rows and n columns and located at a side of the drive layer facing away from the substrate, and drive chips. The drive layer includes thin film transistors, and the substrate is an integral structure. Both m and n are positive integers and m and n are not both 1. The cell structures each include light-emitting devices, and the cell structures are driven independently from each other. One of the cell structures corresponds to at least one of the drive chips.

BRIEF DESCRIPTION OF DRAWINGS

In order to more clearly depicts the embodiments of the present disclosure or the technical solution in the related art, the drawings used in the description of the embodiments or the related art will be briefly described below. The drawings in the following description are used in some embodiments of the present disclosure. Those skilled in the art can obtain other drawings based on these drawings.

DESCRIPTION OF EMBODIMENTS

In order to better understand technical solutions of the present disclosure, the embodiments of the present disclosure are described in detail with reference to the drawings. It should be clear that the described embodiments are merely part of the embodiments of the present disclosure rather than all of the embodiments. It is obvious for those skilled in the art that other embodiments made based on the embodiments of the present disclosure fall within the protection scope of the present disclosure.

The terms used in the embodiments of the present disclosure are merely for the purpose of describing specific embodiment, rather than limiting the present disclosure. The terms "a", "an", "the", and "said" in a singular form in the embodiments of the present disclosure and the attached claims are also intended to include plural forms thereof, unless noted otherwise.

In the related art, mini LEDs are used for large-screen display, and a printed circuit board (PCB) is used as a base for carrying the mini LEDs. The PCB has an extremely mature production process, but its production cost is relatively high. In the related art, the solution for large-screen display usually includes: manufacturing multiple small-sized screens each including LEDs, and then splicing the small-sized screens to form a large-sized display screen. The large-sized screen manufactured through splicing has relatively large display dark areas at the splicing positions between the small-sized screens. That is, brightness differs at the splicing positions and the small-sized screens. When the large-sized LED screen is used for the backlight in the LCD, the display dark areas cause non-uniform backlight, which affects the uniformity of display brightness. When the large-sized LED screen is used as a display panel, each small-sized screen separately displays a part of the complete screen, and the display dark areas can lead to the fragmentation of the screens displayed by the small-sized screens, affecting the integrity of the large-sized display screen and seriously affecting the visual experience.

An embodiment of the present disclosure provides a light-emitting module. A drive substrate including thin film transistors is configured to carry LEDs, and small-sized light-emitting cell structures are manufactured on a same drive substrate, such that there is no physical splicing gap formed between the cell structures, thereby reducing the production cost and the display dark areas between adjacent cell structures. The light-emitting module provided in this embodiment of the present disclosure can be used as a display panel, or used as a backlight module in the LCD.

Figure 1:
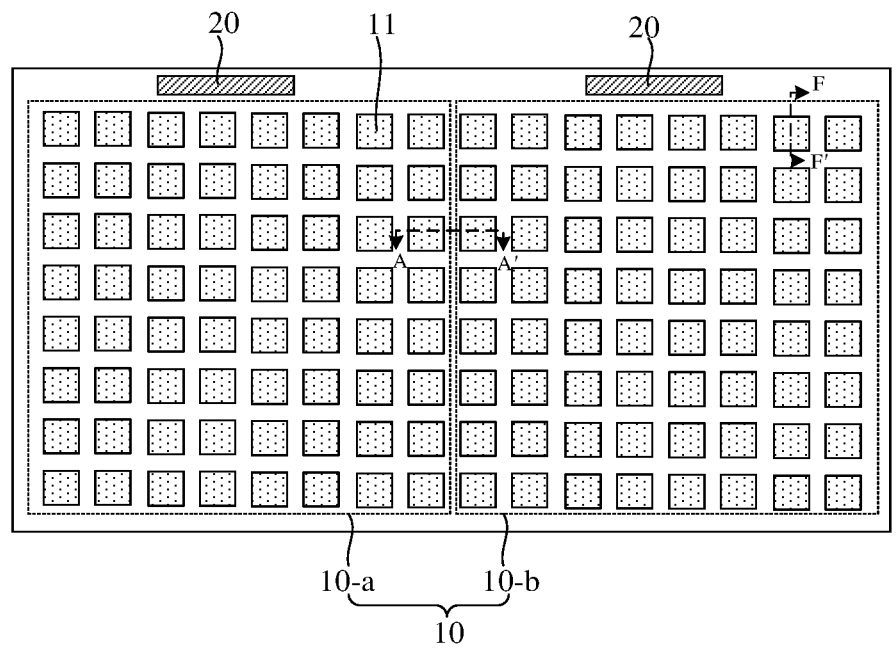
FIG. 1 is a schematic diagram of a light-emitting module according to an embodiment of the present disclosure.
Figure 2:
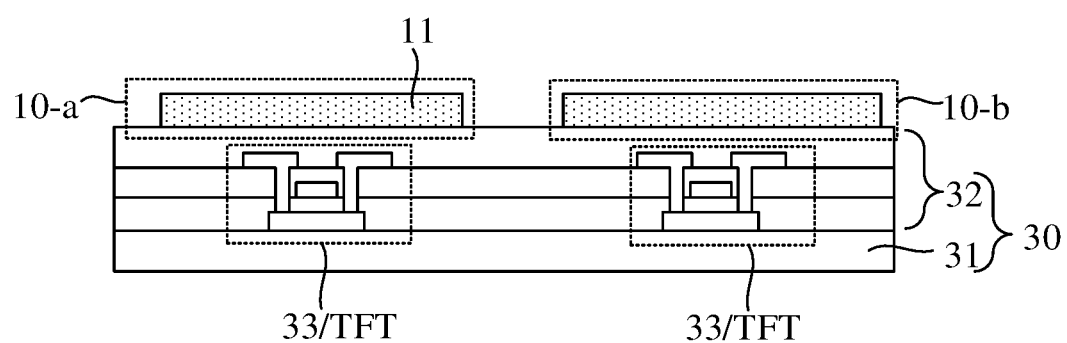
FIG. 2 is a cross-sectional view along a line A-A' shown in FIG. 1.

FIG. 1 is a schematic diagram of a light-emitting module according to an embodiment of the present disclosure. FIG. 2 is a cross-sectional view along a line A-A' in FIG. 1. The light-emitting module provided in the embodiment of the present disclosure includes cell structures arranged in an array of m rows and n columns, m and n are positive integers, and m and n are not both 1.

For example, in FIG. 1, m=1 and n=2. As shown in FIG. 1, the light-emitting module includes two cell structures 10, namely, a cell structure 10-*a* and a cell structure 10-*b*. The cell structure 10 includes light-emitting devices 11, and the cell structures 10 are driven independently from each other. One cell structure 10 corresponds to at least one of the drive chips 20. For example, in FIG. 1, one cell structure 10 corresponds to one drive chip 20. In some embodiments, the light-emitting devices 11 are mini LEDs, and the size of the light-emitting device 11 is smaller than or equal to 3 mm. In some other embodiments, the size of the light-emitting device 11 is smaller than or equal to 200 µm. The cell structure 10 are driven independently from each other. The light-emitting devices 11 of different cell structures 10 do not affect each other during operation, and the light-emitting devices 11 of the cell structure 10 can be independently driven to emit light.

In an embodiment of the present disclosure, cell structures 10 are driven independently from each other, such that the brightness of the cell structures 10 can be independently adjusted, which can achieve zonal dimming in the backlight field, thereby reducing power consumption.

In some embodiments, the light-emitting devices 11 include a red light-emitting device configured to emit red light, a blue light-emitting device configured to emit blue light, and a green light-emitting device configured to emit green light. At least one red light-emitting device, at least one blue light-emitting device, and at least one green light-emitting device form a display pixel, and one display pixel can cooperatively emit white light. It is understood that the cell structure 10 in the embodiment of the present disclosure includes display pixels.

In some embodiments, the light-emitting devices 11 include a red light-emitting device, a blue light-emitting device, a green light-emitting device, and a white light-emitting device configured to emit white light. In the cell structure 10, the display pixel includes a red light-emitting device, a blue light-emitting device, a green light-emitting device, and a white light-emitting device.

In some embodiments, the light-emitting devices 11 of the cell structure 10 emit light of a same color. In an embodiment, the light-emitting devices 11 of the cell structure 10 are all white light-emitting devices.

As shown in FIG. 2, the light-emitting module includes a drive substrate 30, the drive substrate 30 includes a substrate 31 and a drive layer 32 located at a side of the substrate 31, and the light-emitting devices 11 are all located at a side of the drive layer 32 facing away from the substrate 31. The drive layer 32 includes TFTs, and the substrate 31 is an integral structure. In some embodiments, an active layer of the TFT includes silicon. The cell structure 10 corresponds to pixel circuits 33 located on the drive layer 32. In some embodiments, one pixel circuit 33 is electrically connected to one light-emitting device 11. In some other embodiments, one pixel circuit 33 is electrically connected to two or more light-emitting devices 11.

The light-emitting module provided in the embodiment of the present disclosure uses the drive substrate 30 including the TFTs to drive the light-emitting devices 11 to operate, which can reduce costs compared to the prior art in which a PCB is used as a substrate carrying the mini LEDs. In the related art, the PCB substrate can achieve only passive drive due to the limitation of production accuracy, while the embodiment of the present disclosure can achieve active addressable drive. In the embodiment of the present disclosure, the substrate 31 of the drive substrate 30 is an integral structure, and parts of the drive layer 32 corresponding to the cell structures 10 can be manufactured simultaneously, such that the drive substrate 30 is an integral structure. The m rows and n columns of cell structures 10 that can be independently driven are manufactured at corresponding positions on a same drive substrate 30. That is, the m rows and n columns of small-sized light-emitting structures are spliced to form a large-sized light-emitting structure. There is no physical splicing gap formed between the drive layers 32 corresponding to adjacent cell structures 10, which is beneficial to the mechanical stability of the light-emitting module. The display dark areas between adjacent cell structures 10 can be reduced, and the display splicing boundaries can be weakened. When used as the backlight in the LCD, the light-emitting module provided in this embodiment of the present disclosure can provide relatively uniform backlight for the LCD panel, to ensure brightness uniformity of the display screen. When the light-emitting module provided in this embodiment of the present disclosure is used as a display panel, multiple cell structures 10 can display parts of a complete image, respectively, which can weaken the screen transition boundaries at the splicing positions between the cell structures 10, and can improve the overall display effect.

The cell structure 10 in the embodiment of the present disclosure corresponds to at least one drive chip 20, that is, the light-emitting devices 11 in the cell structure 10 are driven by the corresponding drive chips 20, respectively. A length of a signal line from the drive chip 20 corresponding to the cell structure 10 is not too long, and the impedance on the signal line is small. In the embodiment of the present disclosure, the cell structures 10 are independently driven, the impedance on the signal line can also be reduced, thereby reducing power consumption. The brightness of the cell structures 10 can be independently adjusted, which can realize zonal dimming, and thus reducing power consumption.

In an embodiment of the present disclosure, the cell structures 10 has a drive circuit, and the drive chip 20 corresponding to the cell structure 10 is configured to control, through the drive circuit, the light-emitting devices 11 to emit light. The drive circuit is located in the drive layer 32. In some embodiments, the drive circuit includes a scan driving circuit and a light-emitting control circuit. The drive layer 32 further includes pixel circuits corresponding to the cell structures 10, and one pixel circuit is connected to at least one light-emitting device 11. In an embodiment, the pixel circuit includes a scanning control terminal and a light-emitting control terminal, the scanning control terminal is connected to the scan driving circuit, and the light-emitting control terminal is connected to the light-emitting control circuit. The scan driving circuit and the light-emitting control circuit cooperate with each other in timing to drive the pixel circuit to operate, so as to control the corresponding light-emitting device 11 to emit light, thereby independently control the cell structures 10.

In some embodiments, the substrate 31 is a glass substrate. First, the drive layer 32 is manufactured on the glass substrate to form the drive substrate 30, and the circuit structure corresponding to each cell structure 10 is manufactured in the drive layer 32; then light-emitting devices 11 are transferred to corresponding positions on the drive substrate 30 to form m rows and n columns of cell structures 10. This embodiment provides a light-emitting module with certain rigidity, which can enhance the impact resistance of the light-emitting module during application. Manufacturing the drive layer 32 on the glass substrate through the photolithography process can reduce the production cost. The circuit structures in the drive layer 32 have higher manufacturing precision, which can realize active addressable drive for the light-emitting devices 11. The glass substrate has excellent heat dissipation performance, to meet the demand for heat dissipation performance when the light-emitting module operates at high power, thus avoiding overheating and burn-in of the light-emitting module and improving the performance stability of the light-emitting module.

In some other embodiments, the substrate 31 is a flexible substrate. Manufacturing the drive layer 32 on the flexible substrate forms a drive substrate 30 with certain flexibility. This embodiment provides a light-emitting module with certain flexibility that can be used in flexible display products. Manufacturing the drive layer 32 on the flexible substrate through the photolithography process can reduce the production cost. In addition, the circuit structures in the drive layer 32 have higher manufacturing precision, which can realize active addressable drive for the light-emitting devices 11.

In an embodiment of the present disclosure, the drive chip 20 corresponding to the cell structure 10 is located in a peripheral region of the cell structure 10. It can be seen from FIG. 1 that one drive chip 20 corresponding to the cell structure 10-$a$ is disposed at the periphery of the cell structure 10-$a$, and another drive chip 20 corresponding to the cell structure 10-$b$ is disposed at the periphery of the cell structure 10-$b$. In this way, the position of the drive chip 20 can be designed with reference to the arrangement of the light-emitting devices 11 of the cell structure 10 and the position of the drive circuit corresponding to the cell structure 10, to simplify the method for wiring the signal lines between the drive chip 20 and the drive circuit.

In some embodiments, the drive chip 20 corresponding to the cell structure 10 is located in the peripheral region of the cell structure 10. A drive chip 20 corresponding to at least one of two adjacent cell structures 10 in the light-emitting module is located between the two adjacent cell structures 10.

In some embodiments, the drive chip 20 corresponding to the cell structure 10 is located in the peripheral region of the cell structure 10. Neither of the drive chips 20 corresponding to two adjacent cell structures 10 in the light-emitting module is located between the two adjacent cell structures 10.

In some embodiments, m cell structures 10 are arranged in a column direction of the cell structures 10, a drive chip 20 corresponding to a first cell structure 10 of the m cell structures 10 is located at a side of the first cell structure 10 away from an $m^{th}$ cell structure 10 of the m cell structures 10, and a drive chip 20 corresponding to the $m^{th}$ cell structure 10 is located at a side of the $m^{th}$ cell structure 10 away from the first cell structure 10.

Figure 3:
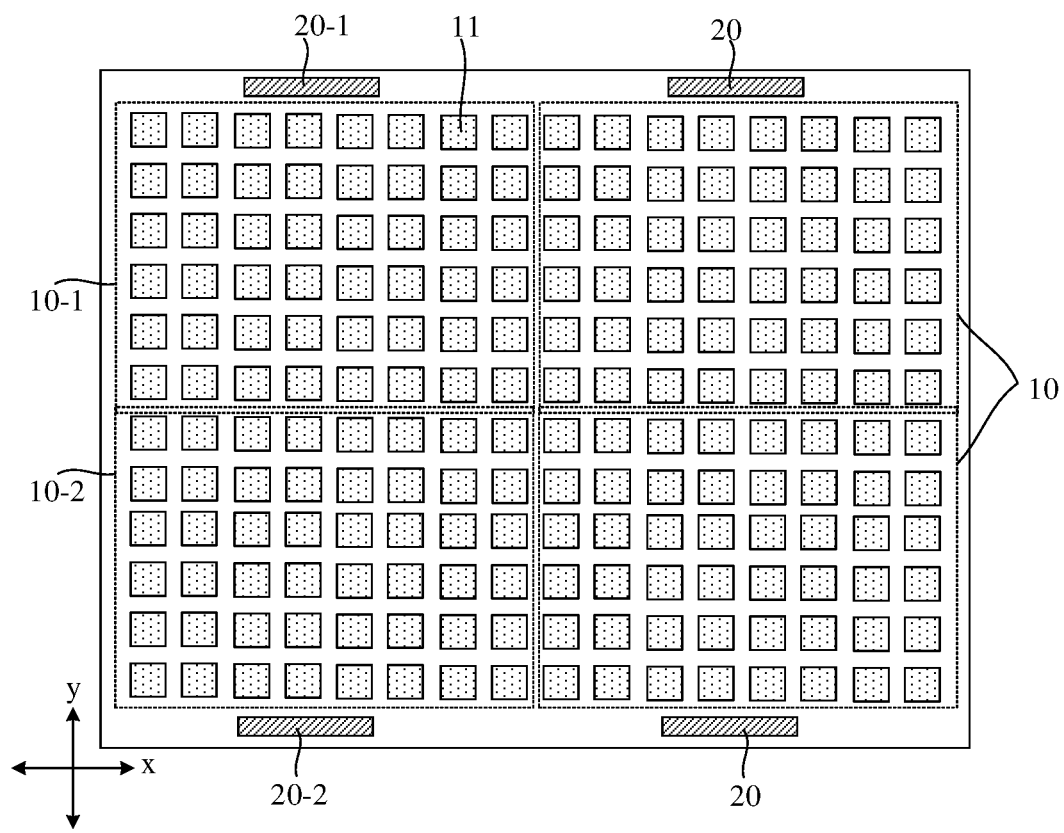
FIG. 3 is a schematic diagram of a light-emitting module according to an embodiment of the present disclosure.

For example, m=2, n=2. FIG. 3 is a schematic diagram of a light-emitting module according to an embodiment of the present disclosure. FIG. 3 shows a row direction x and a column direction y of the cell structures 10. It can be seen that in the left column of cell structures 10, the first cell structure 10-1 and the second cell structure 10-2 are arranged from up to down. A drive chip 20-1 corresponding to the first cell structure 10-1 is located at a side of the first cell structure 10-1 away from the second cell structure 10-2; and a drive chip 20-2 corresponding to the second cell structure 10-2 is located at a side of the second cell structure 10-2 away from the first cell structure 10-1. In the column direction y, a drive chip 20 corresponding to a cell structure 10 located at the edge is disposed at the periphery of the column (that is, the column of the cell structures). In this way, a distance between the cell structure 10 located at the edge and its adjacent cell structure 10 in the column direction y can be reduced, and thus the splicing dark areas between the cell structures 10 is reduced. When used as the backlight in the LCD, the light-emitting module can provide relatively uniform backlight for the LCD panel, to ensure brightness uniformity of the display screen. When the light-emitting module is used as a display panel, the cell structures 10 display parts of the complete image, respectively, which can weaken the screen transition boundaries at the splicing positions between the cell structures 10, and improve the overall display effect.

In some embodiments, all drive chips 20 are located in a peripheral region of the m rows and n columns of cell structures 10. As shown in FIG. 3, the drive chips 20 are all disposed at the periphery of the two rows and two columns of cell structures 10, which can reduce the splicing dark areas between two adjacent cell structures 10 in the column direction y and weaken the display splicing boundaries at the splicing positions in the column direction y.

In an embodiment of the present disclosure, one cell structure 10 corresponds to a group of drive circuits, and the drive chip 20 controls the light-emitting devices 11 of the cell structure 10 through the drive circuits. The positions of the drive circuits can be designed in other embodiment of the present disclosure.

Figure 4:
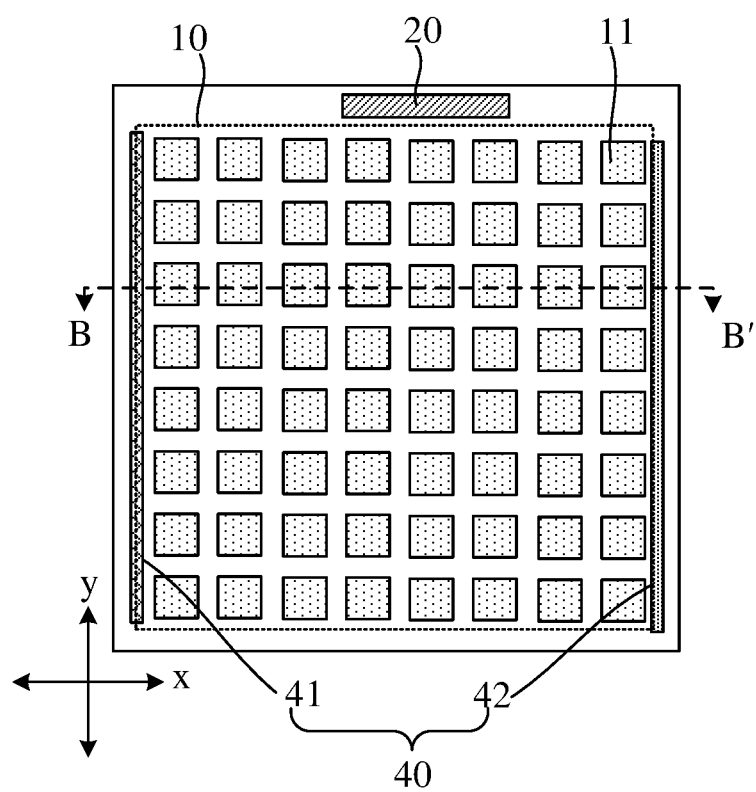
FIG. 4 is a partial view of a light-emitting module according to an embodiment of the present disclosure.
Figure 5:
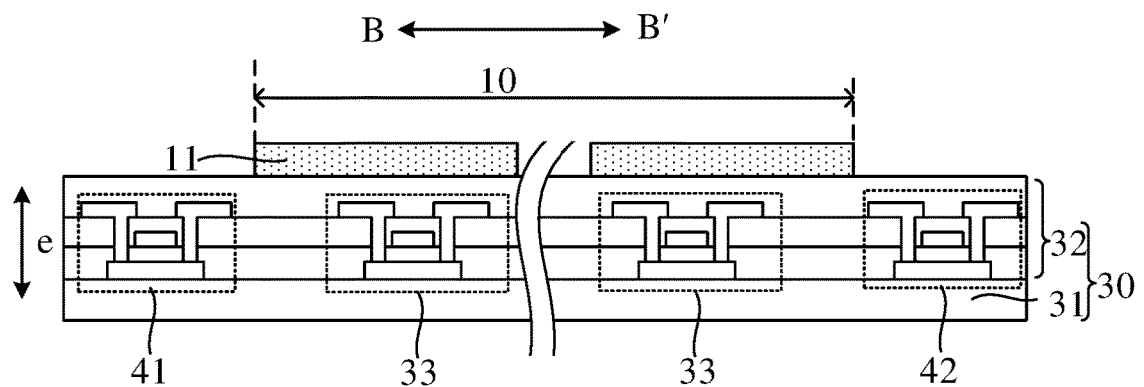
FIG. 5 is a cross-sectional view along a line B-B' shown in FIG. 4.

In some embodiments, at least one cell structure does not overlap its corresponding drive circuits in a direction perpendicular to a plane of the substrate. FIG. 4 is a partial view of a light-emitting module according to an embodiment of the present disclosure. FIG. 5 is a cross-sectional view along a line B-B' in FIG. 4.

FIG. 4 shows only one cell structure 10 in the light-emitting module. As shown in FIG. 4, a group of drive circuits 40 corresponding to the cell structure 10 includes a scan driving circuit 41 and a light-emitting control circuit 42. The group of drive circuits 40 is a complex structure including TFTs. FIG. 5 is only a simplified schematic diagram. It can be seen from FIG. 5 that, in the direction e perpendicular to the plane of the substrate 31, the cell structure 10 does not overlap the drive circuit 40 corresponding to the cell structure 10. That the cell structure 10 does not overlap its corresponding drive circuit 40 in this embodiment of the present disclosure indicates that the light-emitting devices 11 of the cell structure 10 do not overlap the drive circuits 40, that is, the drive circuits 40 are disposed at the periphery of the corresponding cell structure 10. The drive layer 32 further includes a pixel circuit 33. In some embodiments, the pixel circuit 33 overlaps a corresponding light-emitting device 11. In the embodiment, the m rows and n columns of cell structures 10 that can be independently driven are manufactured on a same drive substrate 30 and are spliced to form a large-sized light-emitting structure. There is no physical splicing gap formed between the drive layers 32 corresponding to adjacent cell structures 10, which is beneficial to the mechanical stability of the light-emitting module. The display dark areas between adjacent cell structures 10 can be reduced and the display splicing boundaries can be weakened. When used as the backlight in the LCD, the light-emitting module can provide relatively uniform backlight for the LCD panel, to ensure brightness uniformity of the display screen. When the light-emitting module is used as a display panel, the cell structures 10 display parts of the complete images, respectively, which can weaken the screen transition boundaries at the splicing positions between the cell structures 10 and improve the overall display effect.

The scan driving circuit 41 and light-emitting control circuit 42 in FIG. 4 are both shown in simplified block diagrams. In practice, the scan driving circuit 41 includes cascaded shift register units, and the light-emitting control circuit 42 also includes cascaded shift register units.

FIG. 4 shows the row direction x and the column direction y of the cell structures. In the embodiment of FIG. 4, the scan driving circuit 41 and the light-emitting control circuit 42 are respectively disposed at the left and right sides of the corresponding cell structure 10 in the row direction x of the cell structures 10. Disposing the drive circuits 40 at the two sides of the cell structure 10 can reduce a distance between the cell structure 10 and another adjacent cell structure 10 to a certain extent, so as to reduce the display dark areas between the two cell structures 10, and weaken the splicing boundaries. In the embodiment of the present disclosure, the disposing manner of the drive circuits 40 can be reasonably designed based on the position of the cell structure 10 in the array of m rows and n columns of the cell structure, so as to reduce the display dark areas between two adjacent cell structures 10.

Figure 6:
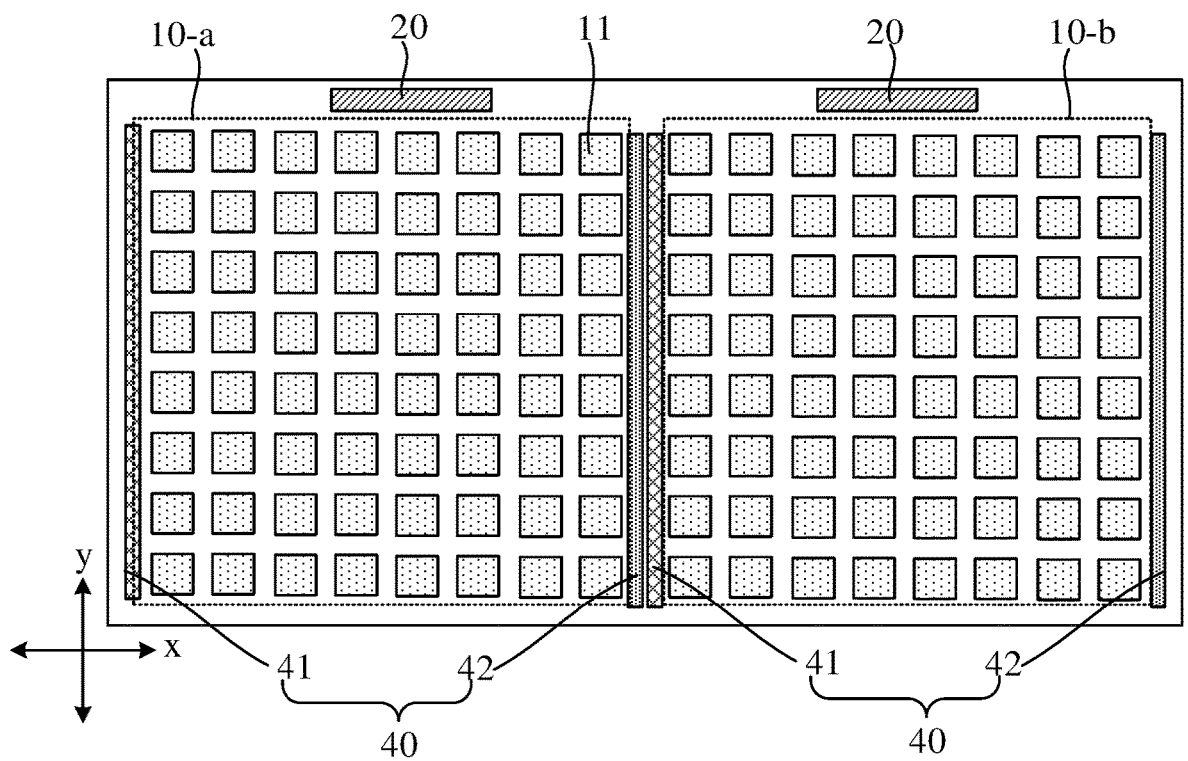
FIG. 6 is a schematic diagram of a light-emitting module according to an embodiment of the present disclosure.

In some embodiments, none of the cell structures overlaps the drive circuit corresponding to the cell structure in the direction perpendicular to the plane of the substrate 31. FIG. 6 is a schematic diagram of a light-emitting module according to an embodiment of the present disclosure. As shown in FIG. 6, for example, m=1, and n=2. The light-emitting module includes a cell structure 10-a and a cell structure 10-b arranged in a row direction x. FIG. 6 is a top view of the light-emitting module. It can be understood that the top view direction is the same as the direction perpendicular to the plane of the substrate 31. It can be seen from FIG. 6 that the two cell structures 10 do not overlap their corresponding drive circuits 40, respectively. The drive mode of the cell structures 10 can be designed according to the actual needs. The drive circuits 40 are disposed at a same side of the corresponding cell structure 10, or the drive circuits 40 are disposed at the left and right sides of the corresponding cell structure 10, respectively. This implementation does not affect the manner for arranging the pixel circuits in the drive layer 32 and can simplify the manner for designing wires in the drive layer 32. The m rows and n columns of cell structures 10 that can be independently driven are manufactured on the same drive substrate 30 to form a large-sized light-emitting structure, and the drive substrate 30 is an integral structure, which is beneficial to the mechanical stability of the light-emitting module. There is no physical splicing gap formed between the drive layers 32 corresponding to adjacent cell structures 10, such that the display dark areas between adjacent cell structures 10 can be reduced and the display splicing boundaries can be weakened. When used as the backlight in the LCD, the light-emitting module can provide relatively uniform backlight for the LCD panel, to ensure brightness uniformity of the display screen. When the light-emitting module is used as a display panel, the cell structures 10 display parts of the complete image, respectively, which can weaken the screen transition boundaries at the splicing positions between the cell structures 10 and improve the overall display effect.

Figure 7:
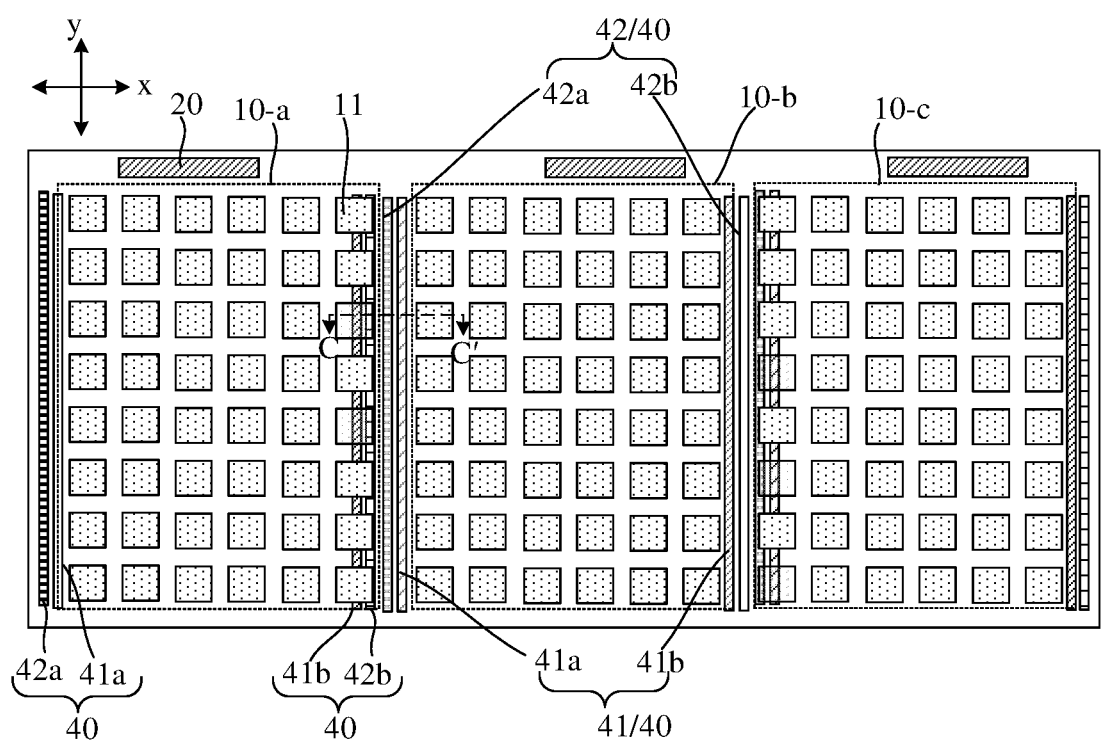
FIG. 7 is a schematic diagram of a light-emitting module according to an embodiment of the present disclosure.

FIG. 7 is a schematic diagram of a light-emitting module according to an embodiment of the present disclosure. In some embodiments, FIG. 7 schematically shows 1 row and 3 columns of cell structures 10, that is, m=1 and n=3. The three cell structures are 10-a, 10-b and 10-c. As shown in FIG. 7, the scan driving circuit 41 includes a first scan driving circuit 41a and a second scan driving circuit 41b, and the light-emitting control circuit 42 includes a first light-emitting control circuit 42a and a second light-emitting control circuit 42b. For the cell structure 10-b in the column 2 in FIG. 7, in a row direction x of the cell structures 10, the first scan driving circuit 41a and the second scan driving circuit 41b are respectively disposed at two sides of the cell structure 10-b, and the first light-emitting control circuit 42a and the second light-emitting control circuit 42b are also respectively disposed at two sides of the cell structure 10-b. In an embodiment, the cell structure 10-b can be bilaterally driven, to improve the display uniformity of the cell structure 10-b.

Figure 8:
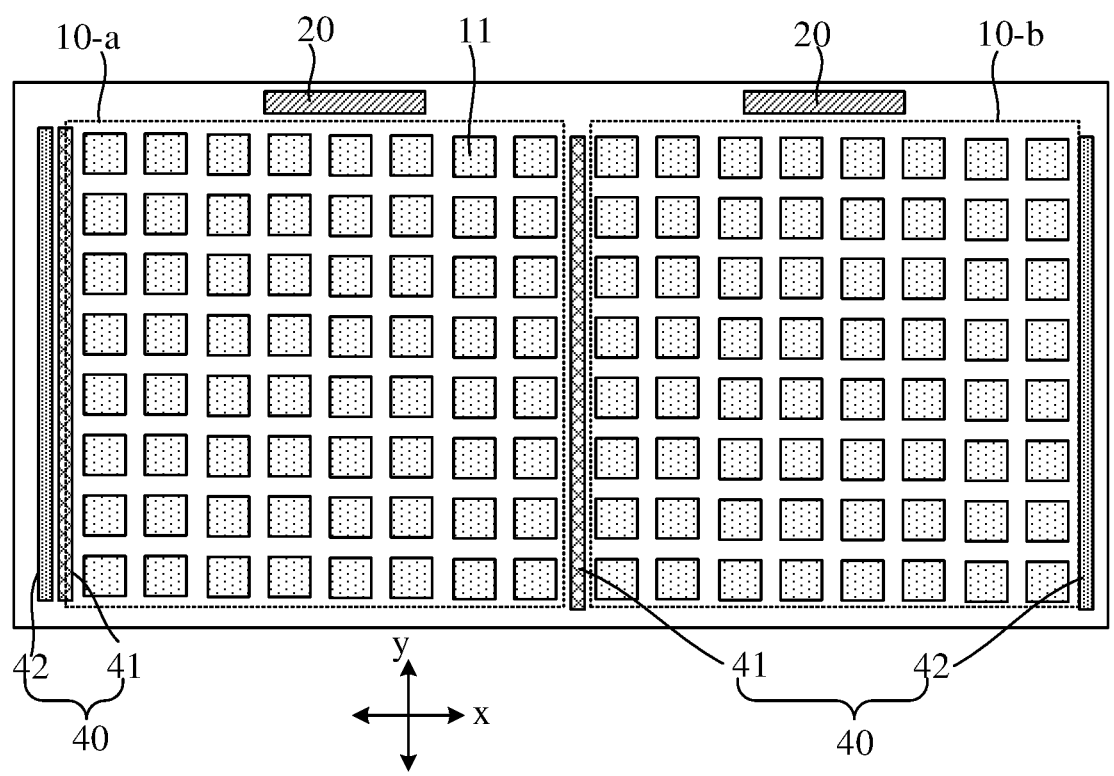
FIG. 8 is a partial view of a light-emitting module according to an embodiment of the present disclosure.

In some embodiments, for at least a part of the cell structures 10, in the row direction x of the cell structures 10, the scan driving circuit 41 and the light-emitting control circuit 42 are disposed at a same side of the corresponding cell structure 10. FIG. 8 is a partial view of a light-emitting module according to an embodiment of the present disclosure. FIG. 8 schematically shows two cell structures 10-a and 10-b arranged in a row direction x in the light-emitting module. As shown in FIG. 8, the scan driving circuit 41 and the light-emitting control circuit 42 that correspond to the cell structure 10-a are located at a side of the cell structure 10-a away from the cell structure 10-b, and the scan driving circuit 41 and the light-emitting control circuit 42 that correspond to the cell structure 10-*b* are located at two sides of the cell structure 10-*b* in the row direction x. In the embodiment of FIG. 8, only the scan driving circuit 41 corresponding to the cell structure 10-*b* is disposed between the cell structure 10-*a* and the cell structure 10-*b*, and the drive circuits 40 corresponding to the cell structure 10-*a* are disposed at the side away from the cell structure 10-*b*, such that the space occupied by the circuit structure disposed between the cell structure 10-*a* and the cell structure 10-*b* can be reduced. As such, the display dark area between the cell structure 10-*a* and the cell structure 10-*b* can be reduced, and the display splicing boundary is weakened. When used as the backlight in the LCD, the light-emitting module can provide relatively uniform backlight for the LCD panel, to ensure brightness uniformity of the display screen. When the light-emitting module is used as a display panel, the cell structure 10 display parts of the complete image, respectively, which can weaken the screen transition boundaries at the splicing positions between the cell structures 10 and improve the overall display effect.

In some embodiments, n cell structures are arranged in the row direction of the cell structures, a drive circuit corresponding to a first cell structure of the n cell structures is located at a side of the first cell structure away from an $n^{th}$ cell structure of the n cell structures, and a drive circuit corresponding to the $n^{th}$ cell structure is located at a side of the $n^{th}$ cell structure away from the first cell structure.

Figure 9:
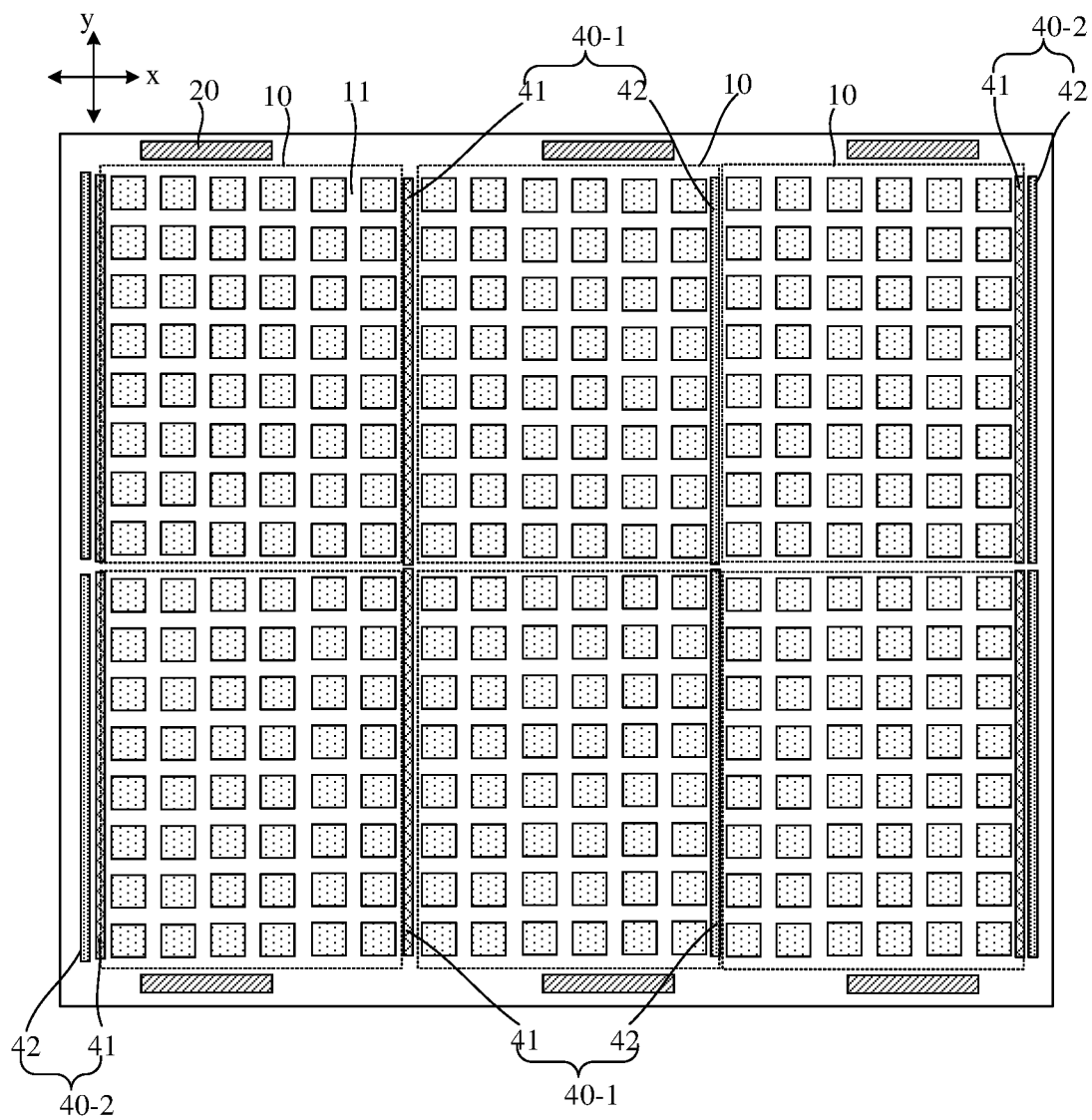
FIG. 9 is a schematic diagram of a light-emitting module according to an embodiment of the present disclosure.

For example, m=2 and n=3. FIG. 9 is a schematic diagram of a light-emitting module according to an embodiment of the present disclosure. FIG. 9 schematically shows a total of six cell structures 10 in 2 rows and 3 columns. As shown in FIG. 9, a scan driving circuit 41 and a light-emitting control circuit 42 in a drive circuit group 40-1 are located at two sides of the corresponding cell structure 10, respectively, and a scan driving circuit 41 and a light-emitting control circuit 42 in a drive circuit group 40-2 are located at a same side of the corresponding cell structure 10. The drive circuit group 40-1 is configured to drive the cell structures 10 located in the column 2, and the drive circuit groups 40-2 are configured to drive the cell structures 10 in the columns 1 and the cell structures 10 located in the column 3. Taking the cell structures 10 located in the row 1 as an example, the drive circuit group 40-2 corresponding to the first cell structure 10 is located at a side of the first cell structure 10 away from the third cell structure 10, and the drive circuit group 40-2 corresponding to the third cell structure 10 is located at a side of the third cell structure 10 away from the first cell structure 10. In the embodiment, the drive circuit 40 corresponding to the cell structure 10 located at the edge in the row direction x is disposed at the periphery of the row in which the cell structure 10 is located (that is, the row of the cell structure), such that a distance between the cell structure 10 located at the edge in the row direction x and its adjacent cell structure 10 can be reduced, thereby reducing the splicing dark area between the cell structures 10.

Figure 10:
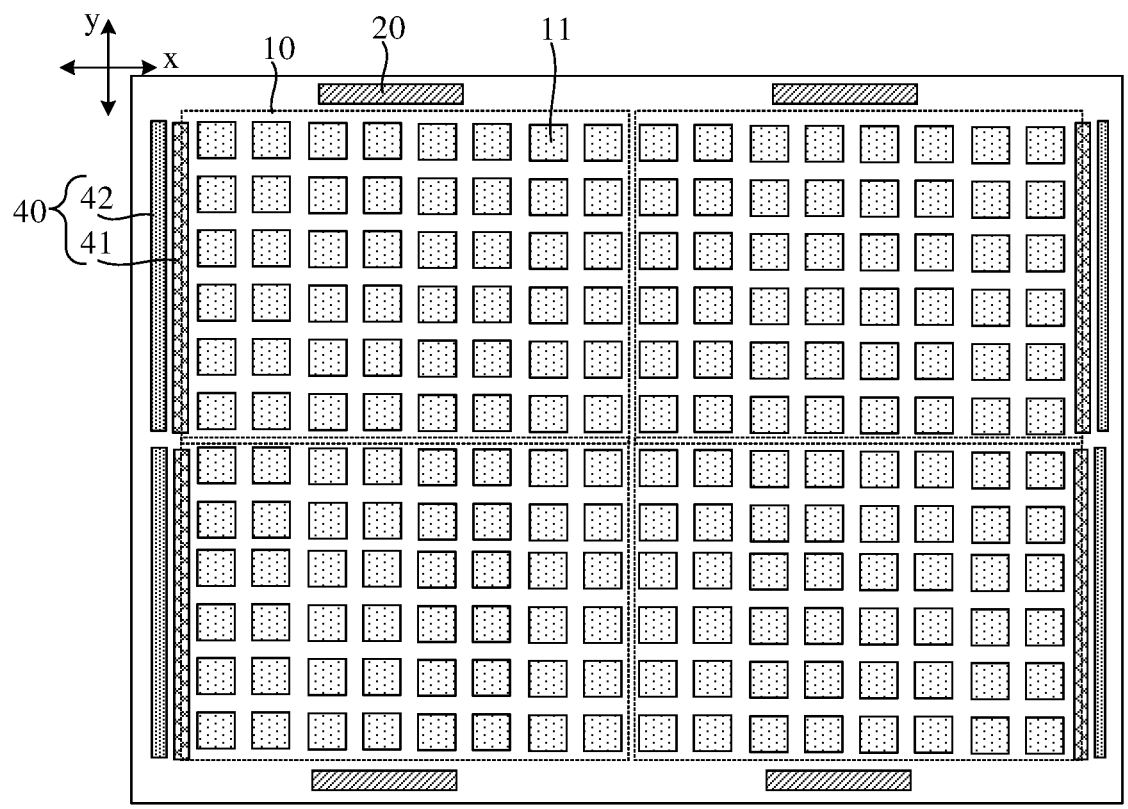
FIG. 10 is a schematic diagram of a light-emitting module according to an embodiment of the present disclosure.

In another embodiment, for example, m=2, and n=2. FIG. 10 is a schematic diagram of a light-emitting module according to an embodiment of the present disclosure. FIG. 10 schematically shows a total of four cell structures 10 in 2 rows and 2 columns. As shown in FIG. 10, there are two cell structures 10 in the row direction x, drive circuits 40 corresponding to the two cell structures 10 are located at the periphery of the cell structure row, to reduce the distance between two adjacent cell structures 10 to a greater extent. In addition, in this embodiment of the present disclosure, the cell structures 10 are carried on a same drive substrate 30, and there is no physical splicing gap between drive layers corresponding to the cell structures 10. In this embodiment, a distance between two adjacent light-emitting devices 11 that respectively belong to two of the cell structures 10 in the row direction x is close to a distance between two light-emitting devices 11 in a same cell structure 10. This effectively weakens the display splicing boundaries between two adjacent cell structures 10 and improves the overall display effect. In addition, in the embodiment of FIG. 10, the drive circuits 10 corresponding to the cell structure 10 are located at a side in the row direction x, and the drive modes of the cell structures 10 are the same, such that the control mode of the light-emitting module is simpler.

Figure 11:
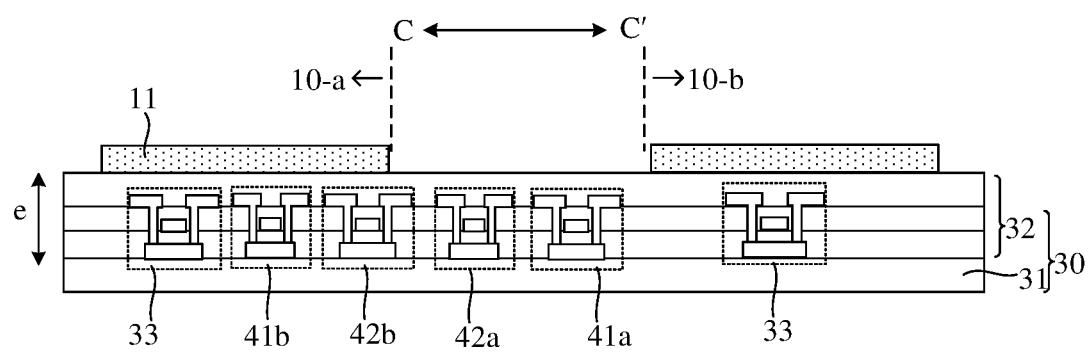
FIG. 11 is a cross-sectional view along a line C-C' shown in FIG. 7.

In some other embodiments, at least one cell structure 10 overlaps at least a part of a corresponding drive circuit 40 in the direction perpendicular to the plane of the substrate 31. FIG. 11 is a cross-sectional view along a line C-C' in FIG. 7. As shown in FIG. 11, the cell structure 10-*a* at least partially overlaps a corresponding drive circuits 40 in the direction e perpendicular to the plane of the substrate 31. At least one of the drive circuits 40 that are originally to be disposed at the periphery of the cell structure 10 is disposed below light-emitting devices 11 of the cell structure 10-*a*, such that the distance between the cell structure 10-*a* and the adjacent cell structure 10 can be reduced, thereby reducing the display dark areas between the two cell structures 10 and weakening the display splicing boundaries. When used as the backlight in the LCD, the light-emitting module can provide relatively uniform backlight for the LCD panel, to ensure brightness uniformity of the display screen. When the light-emitting module is used as a display panel, the cell structure 10 display parts of the complete image, respectively, which can weaken the screen transition boundaries at the splicing positions between the cell structures 10 and improve the overall display effect.

In some embodiments, one end of at least one of the cell structures 10 in the row direction x of the cell structures 10 overlaps at least one of the drive circuits 40. Still referring to FIG. 7, one end of the cell structure 10-*a* in the row direction x overlaps at least one of the drive circuits 40, and one end of the cell structure 10-*c* in the row direction x also overlaps at least one drive circuit 40. In some embodiments, one end of the cell structure 10 located at the edge of the row direction x overlaps at least one drive circuit 40, and the end of the cell structure 10 overlapping the drive circuit 40 is adjacent to another cell structure 10. In this way, a distance between the cell structure 10 located at the edge and the adjacent cell structure 10 can be reduced, thereby reducing the display dark areas between the cell structures 10 and weakening the display splicing boundaries. When designing the circuit wires in the drive layer 32 corresponding to the cell structure 10 located at the edge of the row direction x, it can only set aside space for a part of the drive circuits 40 at the corresponding end of the cell structure 10, which has a small impact on the wire space of pixel circuits in the drive layer 32.

In some embodiments, one end of at least one cell structure 10 in the row direction x of the cell structures 10 overlaps one of the scan driving circuit 41 and the light-emitting control circuit 42, which reduces a distance between the end of the cell structure 10 and its adjacent cell structure 10, thereby reducing the display dark area between the cell structures 10 and weakening the display splicing boundary.

Figure 12:
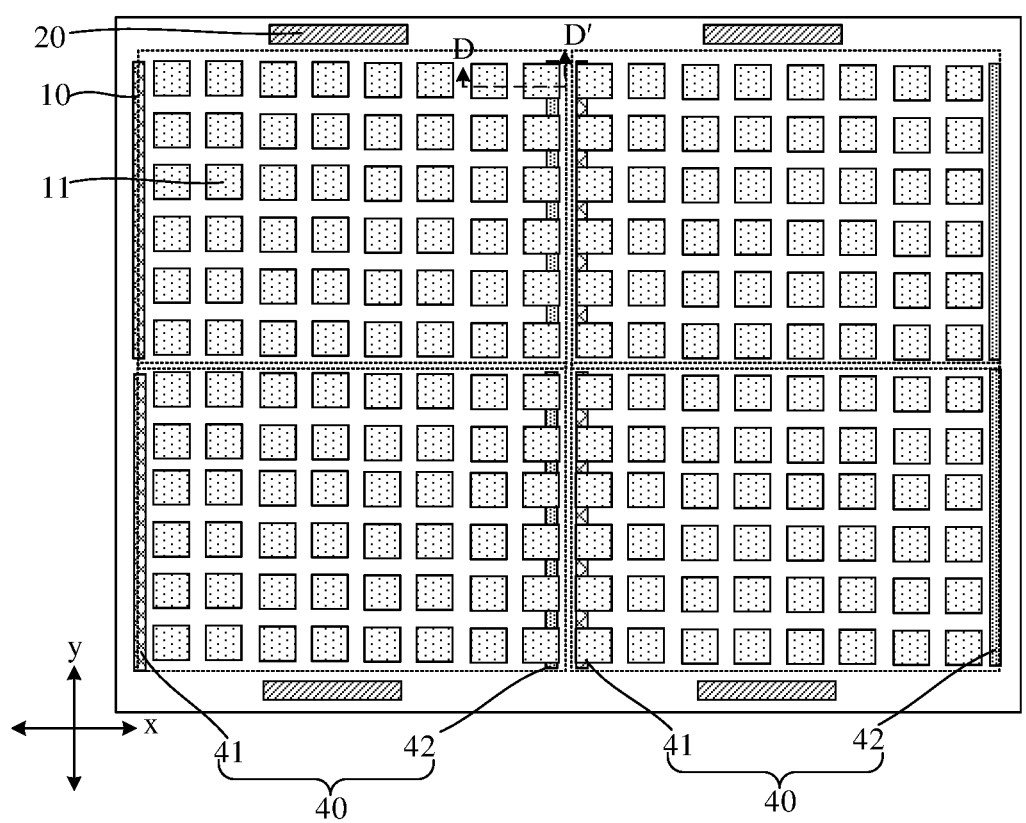
FIG. 12 is a schematic diagram of a light-emitting module according to an embodiment of the present disclosure.

For example, m=2, and n=2. FIG. 12 is a schematic diagram of a light-emitting module according to an embodiment of the present disclosure. As shown in FIG. 12, two cell structures 10 are arranged in a row direction x: the first cell structure 10 and the second cell structure 10 from left to right. One end of the first cell structure 10 close to the second cell structure 10 overlaps a light-emitting control circuit 42, and one end of the second cell structure 10 close to the first cell structure 10 overlaps a scan driving circuit 41. In addition, a scan driving circuit 41 corresponding to the first cell structure 10 is located at a side away from the second cell structure 10, and a light-emitting control circuit 42 corresponding to the second cell structure 10 is located at a side away from the first cell structure 10. In this embodiment, the cell structure 10 overlaps one of the scan driving circuit 41 and the light-emitting control circuit 42 at the splicing position in the row direction x. The distance between two adjacent cell structures 10 can be reduced, thereby weakening the display splicing boundaries between the cell structures 10 and improving the display effect. In the embodiment of FIG. 12, the scan driving circuit 41 and the light-emitting control circuit 42 corresponding to the cell structure 10 in the light-emitting module are disposed at two sides of the row direction x, and the drive modes of the cell structures 10 are the same, such that the control mode of the light-emitting module is simpler.

In some embodiments, one end of at least one cell structure 10 in the row direction x of the cell structures 10 overlaps both the scan driving circuit 41 and the light-emitting control circuit 42. As shown in FIG. 7, one end of the cell structure 10-a close to the cell structure 10-b overlaps both the second scan driving circuit 41b and the second light-emitting control circuit 42b. The scan driving circuit 41 and the light-emitting control circuit 42 that are originally to be disposed at the periphery of the cell structure 10 are disposed below one end of the cell structure 10, such that the end of the cell structure 10 overlaps both the scan driving circuit 41 and the light-emitting control circuit 42. In this way, the distance between two adjacent cell structures 10 in the row direction x can be reduced, thereby reducing the display dark areas between the cell structures 10.

In some embodiments, two ends of at least one cell structure 10 in the row direction x of the cell structures 10 overlap at least two drive circuits 40, respectively. The scan driving circuit 41 and the light-emitting control circuit 42 that are originally to be disposed at the periphery of the cell structure 10 are disposed below the corresponding two ends of the cell structure 10, such that one end of the cell structure 10 overlaps the scan driving circuit 41 and the other end overlaps the light-emitting control circuit 42. When the cell structure 10 is neither the first cell structure nor the last cell structure of the plurality of cell structures 10 arranged in the row direction x, a distance between the cell structure 10 and its adjacent cell structure 10 on the left side of the row direction x can be reduced, and a distance between the cell structure 10 and its adjacent cell structure 10 on the right side of the row direction x can also be reduced, thereby weakening the display splicing boundaries between the adjacent cell structures 10 in the row direction x and improving the overall display effect.

In some embodiments, one end of at least one cell structure 10 in the row direction x of the cell structures 10 overlaps the scan driving circuit 41, and the other end of the cell structure 10 in the row direction x of the cell structures 10 overlaps the light-emitting control circuit 42.

Figure 13:
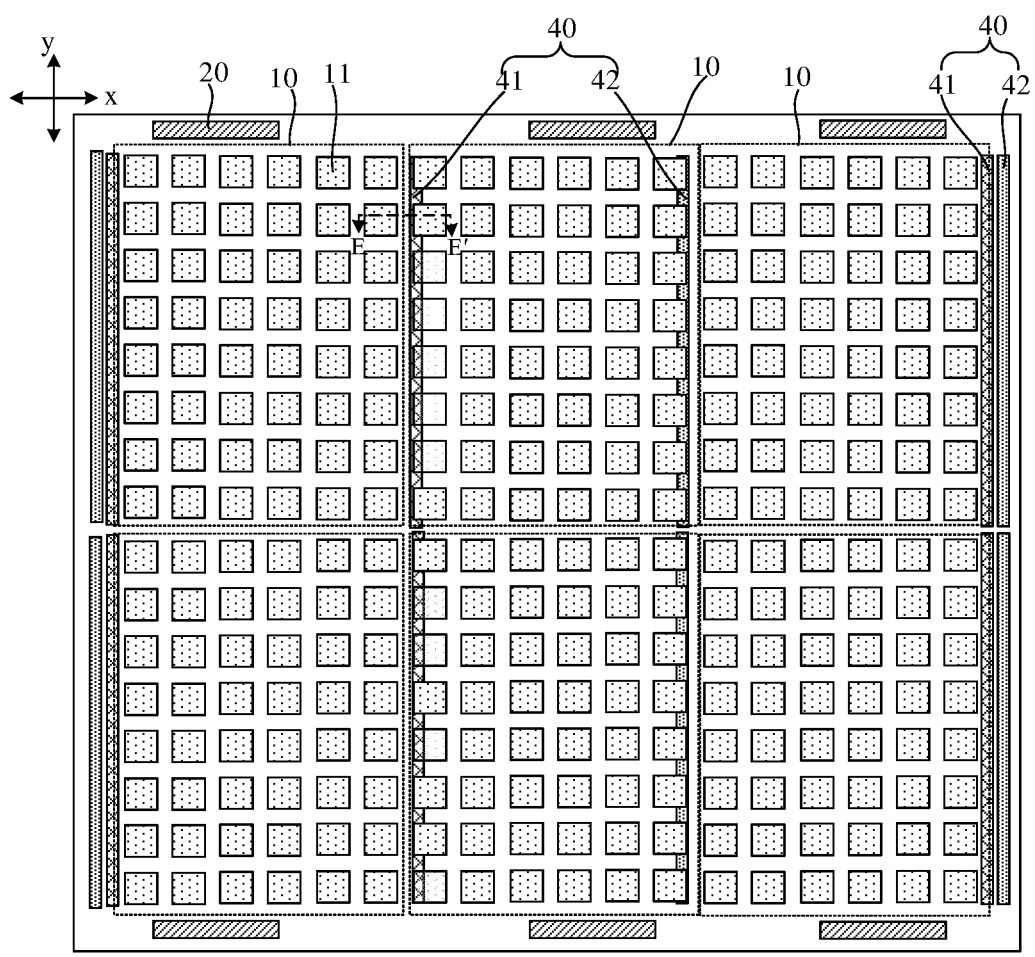
FIG. 13 is a schematic diagram of a light-emitting module according to an embodiment of the present disclosure.

For example, m=2, and n=3. FIG. 13 is a schematic diagram of a light-emitting module according to an embodiment of the present disclosure. As shown in FIG. 13, there are a total of three columns of cell structures from left to right. In the second column of cell structures, one end of the cell structure 10 in the row direction x overlaps the scan driving circuit 41, and the other end of the cell structure 10 overlaps the light-emitting control circuit 42. The scan driving circuit 41 and the light-emitting control circuit 42 that are originally to be disposed at the periphery of the cell structure 10 are disposed below two ends of the cell structure 10, such that one end of the cell structure 10 overlaps the scan driving circuit 41 and the other end overlaps the light-emitting control circuit 42. In this way, the distance between two adjacent cell structures 10 in the row direction x can be reduced, thereby reducing the display dark areas between the cell structures 10. In the embodiment of FIG. 13, the drive circuits 40 corresponding to the two cell structures 10 located at the two ends of the cell structure row in the row direction x (that is, the cell structure in the first column and the cell structure in the third column from left to right) are disposed at the periphery of the cell structure row, which can reduce a distance between the first cell structure 10 and the second cell structure 10 in the row direction x, and a distance between the second cell structure 10 and the third cell structure 10 in the row direction x. In the embodiment of FIG. 13, the distance between any two adjacent cell structures 10 in the row direction x is relatively small, which can effectively resolve the problem of the splicing dark areas between the adjacent cell structures 10.

In some embodiments, one end of at least one cell structure 10 in the row direction x of the cell structures 10 overlaps the first scan driving circuit 41a and the first light-emitting control circuit 42a, and the other end of the cell structure 10 in the row direction x of the cell structures 10 overlaps the second scan driving circuit 41b and the second light-emitting control circuit 42b.

Figure 14:
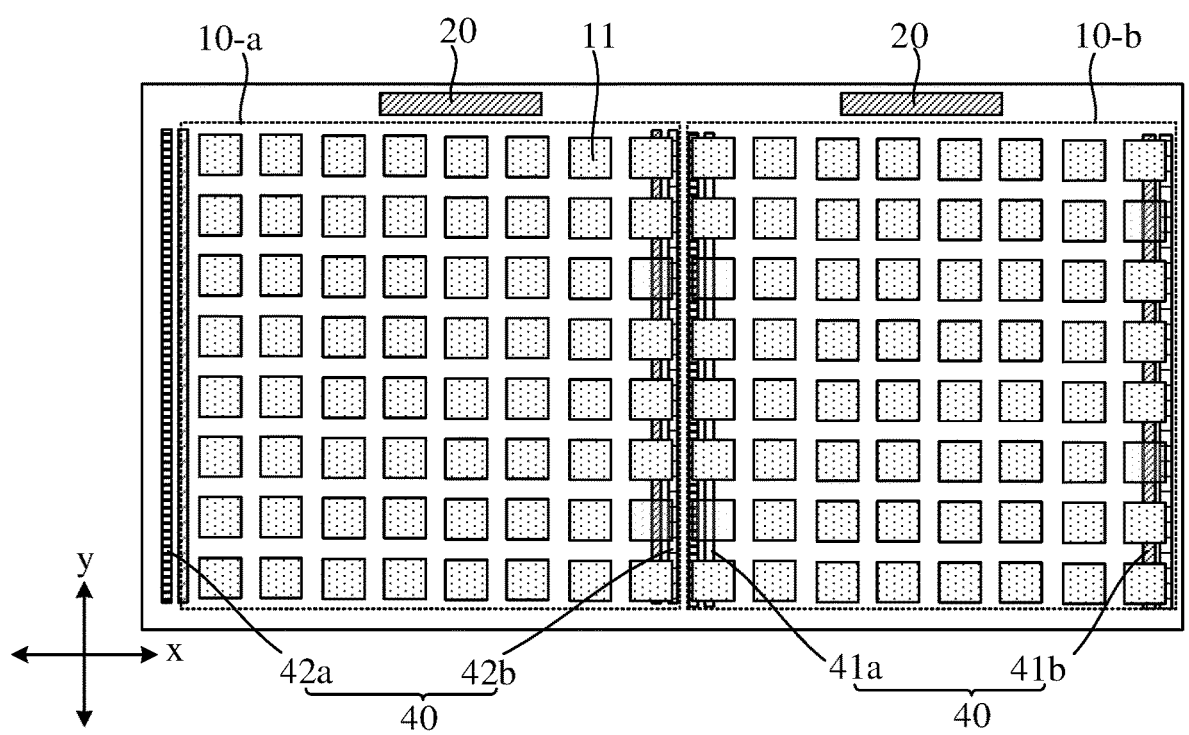
FIG. 14 is a partial view of a light-emitting module according to an embodiment of the present disclosure.

FIG. 14 is a partial view of a light-emitting module according to an embodiment of the present disclosure. FIG. 14 schematically shows two cell structures, i.e., a cell structure 10-a and a cell structure 10-b. It can be seen that one end of the cell structure 10-b overlaps a first scan driving circuit 41a and a first light-emitting control circuit 42a, and the other end of the cell structure 10-b overlaps a second scan driving circuit 41b and a second light-emitting control circuit 42b. The cell structure 10-b is bilaterally driven, which can improve the display brightness uniformity of the cell structure 10-b. The scan driving circuit and the light-emitting control circuit that are originally to be disposed at the periphery of the cell structure 10-b are disposed below the cell structure 10-b, such that distances between two ends of the cell structure 10-b and its adjacent cell structures 10 in the row direction x can be reduced, thus weakening the display splicing boundaries between the cell structure 10-b and the adjacent cell structures 10 in the row direction x. In some embodiments, if the right side of the cell structure 10-b in FIG. 14 is further provided with an adjacent cell structure 10, the drive circuits 40 corresponding to the cell structure 10-b are disposed to overlap the cell structure 10-b, to reduce a distance between the cell structure 10-b and the adjacent cell structure 10 on the right side, thereby weakening the display splicing boundary between the cell structures 10.

In some embodiments, n cell structures 10 are arranged in the row direction x of the cell structures 10, and a $p^{th}$ cell structure 10 of the n cell structures 10 overlaps at least one corresponding drive circuit 40, where p is an integer, and 1<p<n. Taking the embodiment of FIG. 13 as an example. As shown in FIG. 13, there are three cell structures 10 arranged in the row direction x, and two ends of the second cell structure 10 in the row direction x each overlap at least two corresponding drive circuits 40, respectively. When n=4 and the design of this embodiment of the present disclosure is adopted, the second and third cell structures arranged in the row direction x each are disposed to overlap at least two corresponding drive circuits 40, respectively. In this embodiment, drive circuits 40 corresponding to the cell structure 10 in the middle of cell structures arranged in the row direction x are designed, such that the cell structure 10 overlaps at least one corresponding drive circuit 40. In this way, a distance between the cell structure 10 in the middle and an adjacent cell structure 10 can be reduced, thereby weakening the display splicing boundary between the cell structures 10 and improving the display effect. The cell structure in the middle is neither the first nor the last cell structure in the row direction x.

In some embodiments, n cell structures 10 are arranged in the row direction x of the cell structures, one end of the first cell structure 10 close to the $n^{th}$ cell structure 10 overlaps at least one drive circuit 40, and one end of the $n^{th}$ cell structure 10 close to the first cell structure 10 overlaps at least one drive circuit 40. As shown in FIG. 12, two cell structures 10 are arranged in the row direction x, i.e., the first cell structure 10 and the second cell structure 10 from left to right. One end of the first cell structure 10 close to the second cell structure 10 overlaps at least one drive circuit 40, and one end of the second cell structure 10 close to the first cell structure 10 overlaps at least one drive circuit 40. In this embodiment, at a splicing position between two adjacent cell structures 10 in the row direction x, at least one drive circuits 40 corresponding to at least one of the cell structure 10 is disposed below the cell structure 10, which can reduce the space between the two cell structures 10, reduce the display dark area between the two cell structures 10, and weaken the display splicing boundary.

In some other embodiments, the cell structures 10 in the light-emitting module overlap at least one corresponding drive circuit 40. In the embodiment of FIG. 12, four cell structures 10 each overlap at least one corresponding drive circuit 40, which reduces a distance between the adjacent cell structures 10 in the row direction x, thereby reducing the display dark areas between the cell structures 10 and weakening the display splicing boundaries. In this embodiment, the drive chips 20 are disposed at the periphery of the four cell structures 10, that is, the drive chips 20 are disposed at the periphery of the display region. When used as the backlight in the LCD, the light-emitting module can provide relatively uniform backlight for the LCD panel, to ensure brightness uniformity of the display screen. When the light-emitting module is used as a display panel, the cell structure 10 display parts of the complete image, respectively, which can weaken the screen transition boundaries at the splicing positions between the cell structures 10 and improve the overall display effect.

Figure 15:
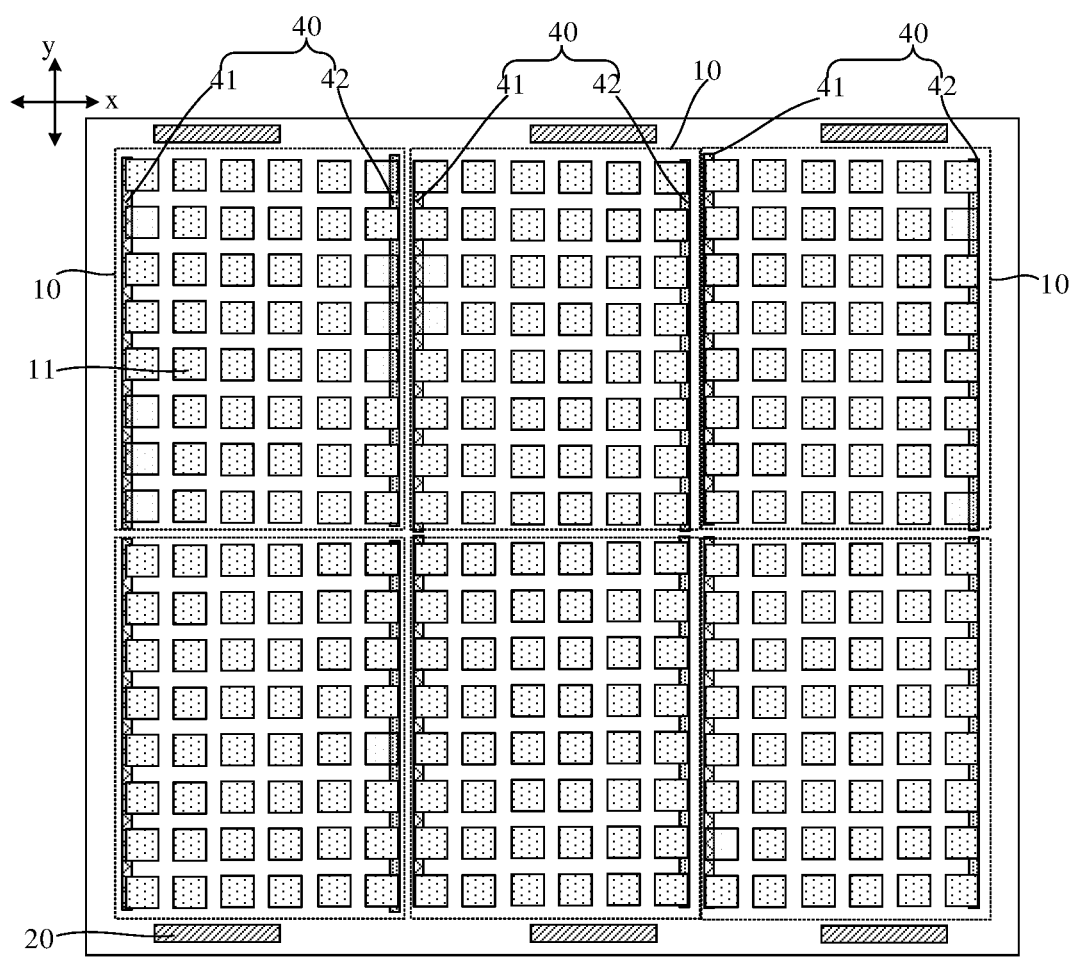
FIG. 15 is a schematic diagram of a light-emitting module according to an embodiment of the present disclosure.

In some other embodiments, the cell structures 10 each overlap the corresponding scan driving circuit 41 and light-emitting control circuit 42. For example, m=2 and n=3. FIG. 15 is a schematic diagram of a light-emitting module according to an embodiment of the present disclosure. The light-emitting module provided in the embodiment of FIG. 15 includes a total of six cell structures 10. It can be seen that each cell structure 10 overlaps the corresponding scan driving circuit 41 and light-emitting control circuit 42. FIG. 15 shows that two ends of each cell structure 10 in the row direction x respectively overlap the scan driving circuit 41 and the light-emitting control circuit 42. This implementation reduces a distance between the adjacent cell structures 10 in the row direction x, thereby reducing the display dark areas between the cell structures 10 and weakening the display splicing boundaries. For a cell structure 10 located at the edge of the row direction x, one end of the cell structure 10 close to the edge of the display region overlaps the drive circuits 40, which can reduce the space for disposing the drive circuits in the non-display region, thus reducing the non-display region, narrowing the bezel, and improving the screen-to-body ratio.

For example, in FIG. 15, the scan driving circuit 41 and the light-emitting control circuit 42 are disposed at the two sides of the corresponding cell structure 10. In some embodiments, the scan driving circuit 41 and the light-emitting control circuit 42 are disposed at a same side of the corresponding cell structure 10, and the cell structure 10 in the light-emitting module overlaps its corresponding scan driving circuit 41 and light-emitting control circuit 42. In some other embodiments, the scan driving circuit 41 includes a first scan driving circuit and a second scan driving circuit, and the first scan driving circuit and the second scan driving circuit are disposed at two sides of the corresponding cell structure 10; the light-emitting control circuit 42 includes a first light-emitting control circuit and a second light-emitting control circuit, and the first light-emitting control circuit and the second light-emitting control circuit are disposed at two sides of the corresponding cell structure 10; and the cell structure 10 in the light-emitting module overlaps its corresponding scan driving circuit 41 and light-emitting control circuit 42.

Figure 16:
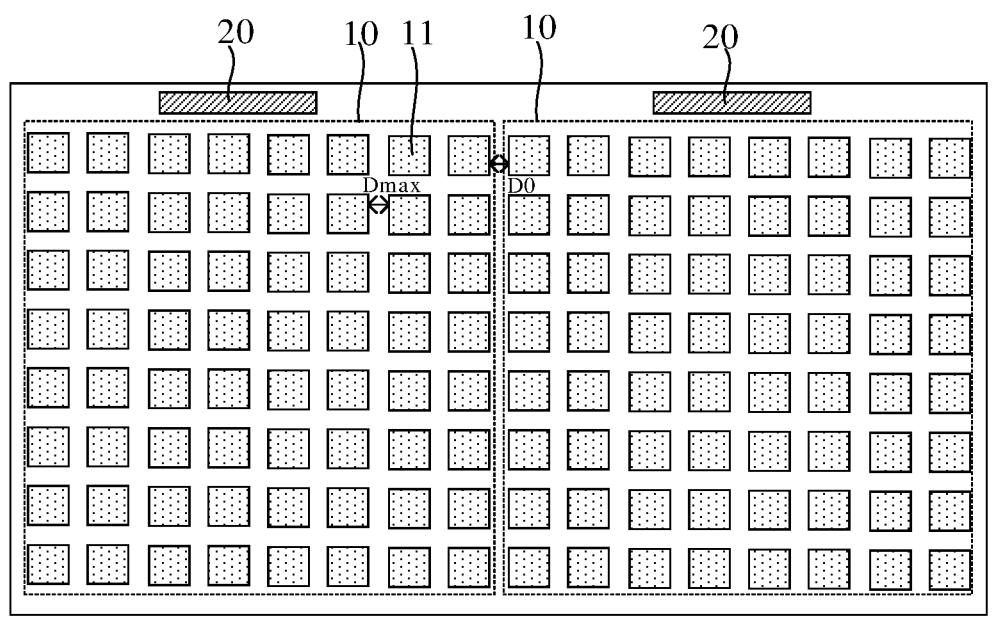
FIG. 16 is a partial view of a light-emitting module according to an embodiment of the present disclosure.

In some embodiments, FIG. 16 is a partial view of a light-emitting module according to an embodiment of the present disclosure. As shown in FIG. 16, in the row direction x of the cell structures 10, a maximum distance between two adjacent light-emitting devices 11 of the cell structure 10 is Dmax, and in the row direction x of the cell structures 10, a distance between two adjacent light-emitting devices 11 that respectively belong to two of the cell structures 10 is D0, where D0≤Dmax. In this way, a width of a non-display region between two adjacent light-emitting devices 11 that belong to two cell structures 10 in the row direction x is not greater than a maximum width of a non-display region between two adjacent light-emitting devices 11 of the cell structure 10. In this way, there is no difference between the display effect of the splicing areas between two adjacent cell structures 10 and the display effect of the areas between two adjacent light-emitting devices 11 with of the cell structure 10, and there is no display splicing boundaries at the splicing positions between adjacent cell structures 10, thereby ensuring the overall display effect.

In some embodiments, as shown in the above embodiment of FIG. 10, drive circuits 40 corresponding to at least one of two adjacent cell structures 10 are disposed at a side away from the splicing side, thereby reducing the distance between the two adjacent cell structures 10, to satisfy D0≤Dmax.

In some other embodiments, as shown in the above embodiment of FIG. 12, at the splicing position between two adjacent cell structures 10, at least one drive circuit 40 corresponding to at least one of the cell structures 10 is disposed to overlap the cell structure 10, thereby reducing the distance between the two adjacent cell structures 10, to enable D0≤Dmax.

Figure 17:
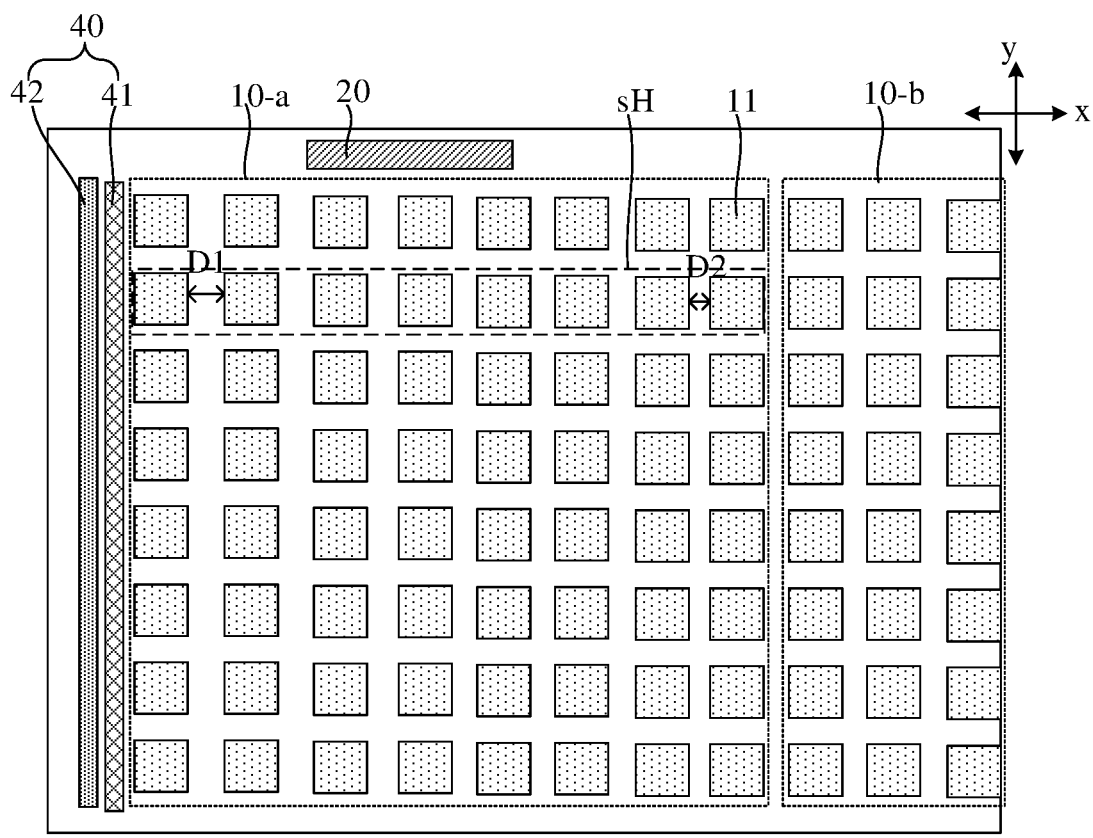
FIG. 17 is a partial view of a light-emitting module according to an embodiment of the present disclosure.

In some embodiments, distances between light-emitting devices 11 arranged in the row direction x in at least one cell structure 10 are designed to be different. FIG. 17 is a partial view of a light-emitting module according to an embodiment of the present disclosure. FIG. 17 schematically shows a cell structure 10-$a$ and a part of an adjacent cell structure 10-$b$. As shown in FIG. 17, drive circuits 40 corresponding to the cell structure 10-*a* are disposed at a side away from the cell structure 10-*b*, and the cell structure 10-*a* is unilaterally driven. In the cell structure 10-*a*, light-emitting devices 11 in the row direction x of the cell structures are arranged in a pixel row sH. From left to right in the pixel row sH, a distance between the first light-emitting device 11 and an adjacent light-emitting device 11 is D1, and a distance between the last light-emitting device 11 and an adjacent light-emitting device 11 is D2, where D1>D2. That is, the distances between the light-emitting devices 11 located at two ends of the row direction x and their adjacent light-emitting devices 11 of the cell structure 10-*a* are different. A distance between two adjacent light-emitting devices 11 at a side close to the drive circuits 40 corresponding to the cell structure 10-*a* is longer, and a distance between two adjacent light-emitting devices 11 at a side away from the drive circuit 40 corresponding to the cell structure 10-*a* is shorter. In this way, the density of light-emitting devices 11 is increased at a side away from the drive circuit 40 corresponding to the cell structure 10-*a*. When the drive circuit 40 located at a side of the pixel line sH drives the pixel line sH, a voltage drop on the signal line leads to lower brightness of the light-emitting devices 11 away from the drive circuit 40, and affects the display uniformity within the cell structure. The design of this embodiment of the present disclosure increases the density of the light-emitting devices 11 at the position away from the drive circuit 40, to compensate for the brightness difference caused by the lower brightness of the light-emitting devices 11 at the position, to improve the display uniformity.

FIG. 17 schematically shows that the drive circuit 40 corresponding to the cell structure 10-*a* is disposed at the side away from the cell structure 10-*b*. In some embodiments, the drive circuit 40 corresponding to the cell structure 10-*a* is located at the end away from the cell structure 10-*b* and at least partially overlaps the cell structure 10-*a*. In this embodiment, distances between the light-emitting devices 11 in the pixel row sH of the cell structure 10-*a* can also be designed to be different to improve the display uniformity.

In some embodiments, in the cell structure 10-*a* shown in the embodiment of FIG. 17, on the side close to the cell structure 10-*b*, distances between any two adjacent light-emitting devices 11 within q light-emitting devices 11 arranged in the row direction x are both D1. q is an integer, and q is less than a quantity of light-emitting devices 11 in the pixel row sH. For example, q is 3, 4, or 5.

In some embodiments, as shown in FIG. 17, in the cell structure 10-*a*, the pixel row sH includes the first light-emitting device 11, the second light-emitting device 11, . . . , and the last light-emitting device 11 in the direction from close to the corresponding drive circuit 40 to away from the drive circuit 40. From the first light-emitting device 11 to the last light-emitting device 11 in the pixel row sH, distances between adjacent light-emitting devices 11 gradually decrease. When the drive circuit 40 located at a side of the pixel line sH drives the pixel line sH, the voltage drop on the signal line leads to lower brightness of the light-emitting devices 11 away from the drive circuit 40, and the brightness of the light-emitting devices 11 gradually decreases along the direction away from the drive circuit 40. Through the design of this embodiment of the present disclosure, the density of the light-emitting devices 11 gradually becomes larger in the direction away from the drive circuit 40, which can make the brightness transition smoother. The density of the light-emitting devices 11 increases at the position away from the drive circuit 40, to compensate for the brightness difference caused by the lower brightness of the light-emitting devices 11 at the position, to improve the display uniformity.

Figure 18:
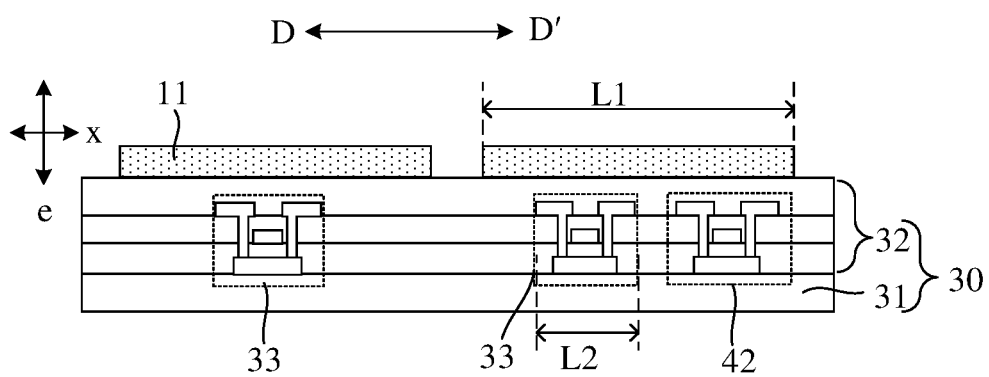
FIG. 18 is a cross-sectional view along a line D-D' shown in FIG. 12.

In some embodiments, a length of at least one light-emitting device 11 in at least one cell structure 10 is smaller than a length of the corresponding pixel circuit 33, to leave space for the drive circuit 40 at the position of the drive layer corresponding to the cell structure 10. At least one drive circuit 40 originally disposed at the periphery of the cell structure 10 is disposed below the cell structure 10, such that the light-emitting device 11 overlaps at least one drive circuit 40. FIG. 18 is a cross-sectional view along a line D-D' in FIG. 12. As shown in FIG. 18, a length of a light-emitting device 11 in a row direction x of the cell structures 10 is L1, and a length of a pixel circuit 33 corresponding to the light-emitting device 11 in the row direction x of the cell structures 10 is L2, where L1>L2. The pixel circuit 33 in FIG. 18 is only a simplified illustration. The pixel circuit 33 includes TFTs, and the length of the pixel circuit 33 in the row direction x can be calculated based on a distance between peripheral edges of TFTs located at two sides of the pixel circuit 33 in the row direction x. In this embodiment of the present disclosure, the length of the pixel circuit 33 in the row direction x is smaller than the length of the corresponding light-emitting device 11 in the row direction x. When the distance between adjacent pixel circuits 33 in the row direction x satisfies a minimum process distance and the distance between adjacent light-emitting devices 11 in the row direction x also satisfies the minimum process distance, corresponding pixel circuits 33 can be manufactured in the drive layer 32 corresponding to the plurality of light-emitting devices 11 arranged in the row direction x, and some space can be left for a part of the drive circuits 40, such that the cell structure 10 overlaps at least one corresponding drive circuit 40. The at least one drive circuit 40 that is originally to be disposed at the periphery of the cell structure 10 is disposed below the cell structure 10, which can reduce the distance between the adjacent cell structures 10, thereby weakening the display splicing boundary between the cell structures 10 and improving the display effect.

Figure 19:
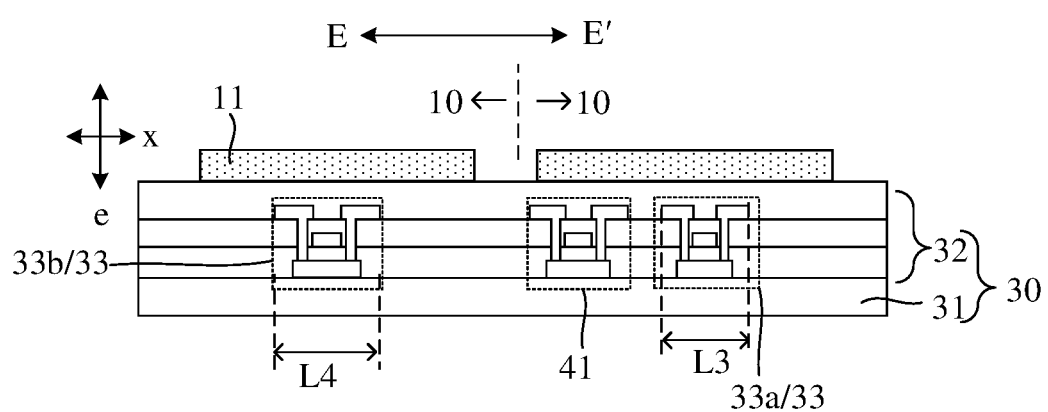
FIG. 19 is a cross-sectional view along a line E-E' shown in FIG. 13.

In some embodiments, the length of a part of pixel circuits 33 in the row direction x is shortened in at least one cell structure 10 to leave space in the drive layer 32 for the drive circuit 40. FIG. 19 is a cross-sectional view along a line E-E' in FIG. 13. As shown in FIG. 19, the pixel circuit 33 include a first pixel circuit 33*a* and a second pixel circuit 33*b*. In the row direction x of the cell structures 10, a length of the first pixel circuit 33*a* is L3, and a length of the second pixel circuit 33*b* is L4, where L3<L4. At a splicing position between two adjacent cell structures 10, a light-emitting device in the left cell structure 10 corresponds to the second pixel circuit 33*b*, and a light-emitting device 11 in the right cell structure 10 corresponds to the first pixel circuit 33*a*, that is, the light-emitting device 11 in the right cell structure 10 is electrically connected to the first pixel circuit 33*a*. This embodiment reduces the length of a part of pixel circuits 33 in the row direction x of the cell structure 10. A distance between TFTs in this pixel circuit 33 can be shortened or the size of at least one TFT can be reduced. In this way, after pixel circuits that can drive the light-emitting devices 11 in the row direction x are arranged in the drive layer 32 corresponding to the cell structure 10, there can be some space left for disposing at least a part of the drive circuits 40. At least one drive circuit 40 that is to be disposed at the periphery of the cell structure 10 is disposed below the cell structure 10, which can reduce the distance between the adjacent cell structures 10, thereby weakening the display splicing boundaries between the cell structures 10 and improving the display effect.

In some other embodiments, the pixel row sH in at least one cell structure 10 is driven in a one-drive-two or one-drive-many manner. For example, one scanning shift register in the scan driving circuit 41 drives two pixel rows sH or drives pixel rows sH. In this way, the space occupied by the drive circuit 40 in the drive layer 32 can be reduced.

Figure 20:
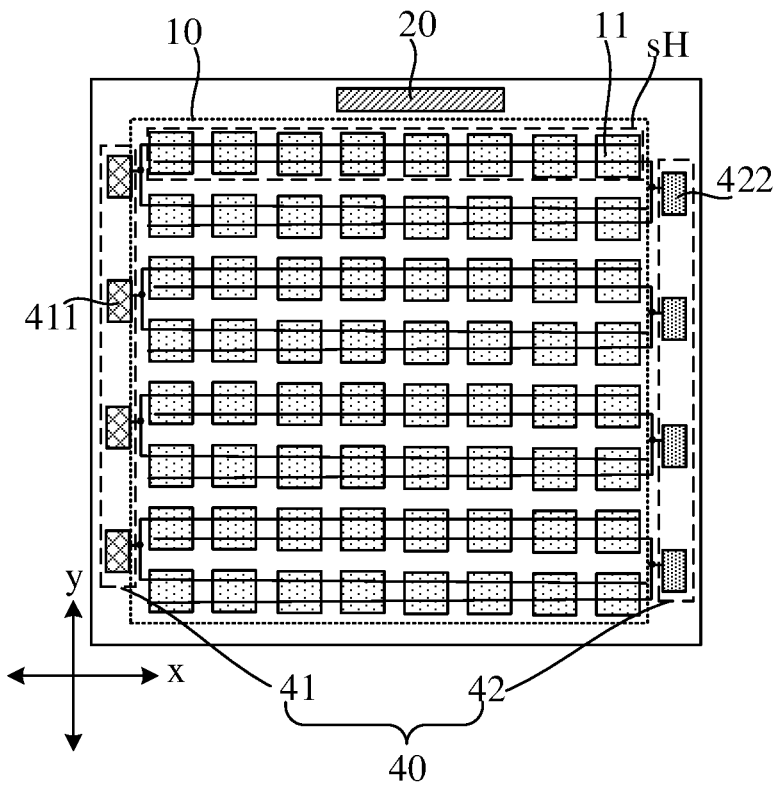
FIG. 20 is a partial view of a light-emitting module according to an embodiment of the present disclosure.

In an embodiment, FIG. 20 is a partial view of a light-emitting module according to an embodiment of the present disclosure. FIG. 20 schematically shows one cell structure 10 and a drive circuit 40 corresponding to the cell structure 10. As shown in FIG. 20, a scan driving circuit 41 includes cascaded scanning shift registers 411, and one scanning shift register 411 drives two pixel rows sH. A light-emitting control circuit 42 includes cascaded light-emitting shift registers 422, and one light-emitting shift register 422 drives two pixel rows sH. With such configuration, a quantity of scanning shift registers 411 disposed in the scan driving circuit 41 and a quantity of light-emitting shift registers 422 in the light-emitting control circuit 42 can be reduced, thereby reducing the space occupied in the drive layer 32 by the drive circuit 40 corresponding to the cell structure 10. In some embodiments, when the drive circuits 40 are disposed at the periphery of the corresponding cell structure 10, the distance between two adjacent cell structures 10 can be reduced. In some embodiments, when at least one drive circuit 40 overlaps the corresponding cell structure 10, the impact of disposing the drive circuit 40 on the pixel circuit 33 can be reduced.

In the embodiment of FIG. 20, for example, the scan driving circuit 41 and the light-emitting control circuit 42 in the drive circuit 40 each use one shift register to drive two pixel rows sH. In some embodiments, in at least one cell structure 10, only the scan driving circuit 41 uses one shift register to drive two or more pixel rows sH, which can reduce the space occupied by the scan driving circuit 41 in the drive layer 32. In some other embodiments, in at least one cell structure 10, only the light-emitting control circuit 42 uses one shift register to drive two or more pixel rows sH, which can reduce the space occupied by the light-emitting control circuit 42 in the drive layer 32.

Figure 21:
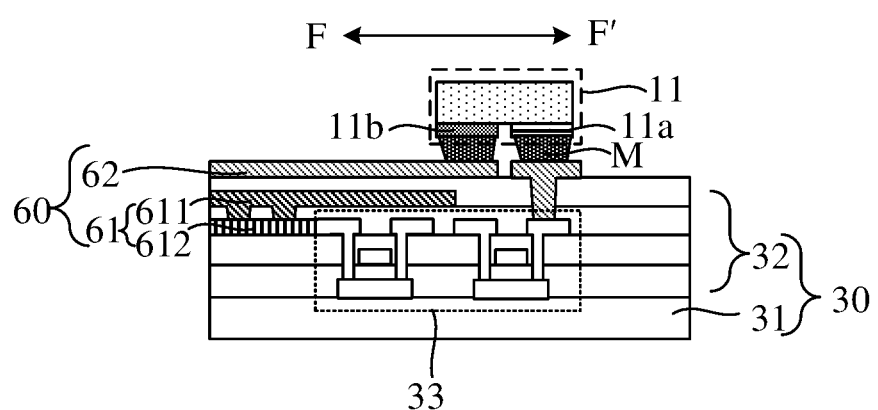
FIG. 21 is a cross-sectional view along a line F-F' shown in FIG. 1.

In some embodiments, the cell structure 10 has a power supply structure connected to the drive chip 20, and power supply structures corresponding to the cell structures 10 are insulated from each other. FIG. 21 is a cross-sectional view along a line F-F' in FIG. 1. As shown in FIG. 21, the light-emitting device 11 includes an anode 11a and a cathode 11b, a power supply structure 60 includes a positive power supply structure 61 and a negative power supply structure 62, the anode 11a of the light-emitting device 11 is connected to the positive power supply structure 61, and the cathode 11b of the light-emitting device 11 is connected to the negative power supply structure 62. The positive power supply structure 61A transmits a constant positive supply voltage signal, and the negative power supply structure 62 transmits a constant negative supply voltage signal. FIG. 21 shows that the anode 11a is connected to the pixel circuit 33 and then to the positive power supply structure 61 through a connecting metal M, and the cathode 11b is connected to the negative power supply structure 62 through a connecting metal M. The cell structures 10 are driven by separate power supply structures 60, respectively, such that a wire of the power supply structure 60 is relatively short, and a voltage drop of the voltage signal transmitted by the drive chip 20 is small. Assuming that the power supply structures in a plurality cell structures 10 are connected to each other, there can be differences among signal delays at the intersection positions between the power supply structures of two adjacent cell structures 10, resulting in an unpredictable overall impact on the voltage signal. With such configuration, the voltage drop on the trace in the power supply structure and the power consumption can be reduced, and mutual interference among different cell structures 10 is avoided.

In some embodiments, as shown in FIG. 21, the positive power supply structure 61 includes a first metal trace 611 and a second metal trace 612 that are connected in parallel, an insulating layer is provided between the first metal trace 611 and the second metal trace 612, and the first metal trace 611 and the second metal trace 612 are connected through a via in the insulating layer. In this way, the overall resistance of the positive power supply structure 61 can be reduced, and thus reducing the voltage drop on the positive power supply structure 61 and the power consumption.

In some other embodiments, the negative power supply structure 62 includes a first metal trace and a second metal trace that are connected in parallel, to reduce the voltage drop on the negative power supply structure 61, thereby reducing power consumption.

Figure 22:
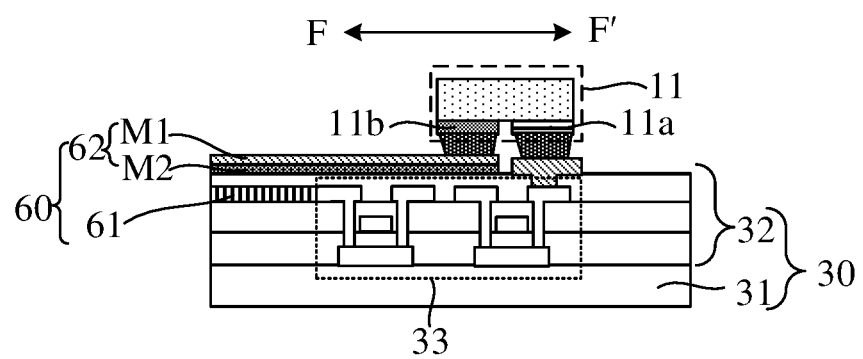
FIG. 22 is another cross-sectional view along a line F-F' shown in FIG. 1.

In some embodiments, FIG. 22 is a cross-sectional view along a line F-F' in FIG. 1. As shown in FIG. 22, a negative power supply structure 62 includes a first metal layer M1 and a second metal layer M2 that are stacked, and no insulating layer is provided between two metal layers. In this way, the overall resistance of the negative power supply structure 62 can be reduced, and thus reducing the voltage drop on the negative power supply structure 62 and the power consumption.

In an embodiment, the negative power supply structure 62 includes three stacked metal layers, i.e., a molybdenum metal layer, an aluminum metal layer, and a molybdenum metal layer.

In some other embodiments, the positive power supply structure 61 includes at least two stacked metal layers, and no insulating layer is disposed between the two adjacent metal layers. In this way, the voltage drop on the positive power supply structure 61 can be reduced, thereby reducing power consumption.

Figure 23:
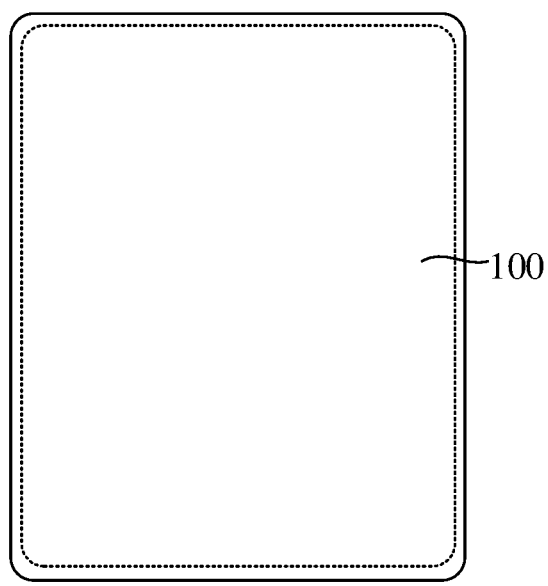
FIG. 23 is a schematic diagram of a display apparatus according to an embodiment of the present disclosure.

An embodiment of the present disclosure further provides a display apparatus. FIG. 23 is a schematic diagram of a display apparatus according to an embodiment of the present disclosure. As shown in FIG. 23, the display apparatus includes a light-emitting module 100 provided in any embodiment of the present disclosure.

Figure 24:
FIG. 24 is a schematic diagram of a display apparatus according to an embodiment of the present disclosure.

An embodiment of the present disclosure further provides a display apparatus. FIG. 24 is a schematic diagram of a display apparatus according to an embodiment of the present disclosure. As shown in the figure, the display apparatus includes a display panel 200 and the light-emitting module 100 provided in any embodiment of the present disclosure. The light-emitting module 100 provides backlight for the display panel 200.

The structure of the light-emitting module 100 has been described in the foregoing embodiments, and details are not described herein again. In this embodiment of the present disclosure, the display apparatus can be, for example, any of devices, having a display function, such as a mobile phone, a tablet computer, a notebook computer, an electronic paper book, a television, or an intelligent watch.

The above merely illustrates embodiments of the present disclosure, and is not intended to limit the present disclosure. Any modifications, equivalent replacements, improvements, and the like made within the principle of the present disclosure shall fall within the scope of the present disclosure.

Finally, it should be noted that the foregoing embodiments are merely intended to describe and not to limit the technical solutions of the present disclosure. Although the present disclosure has been described in detail with reference to the foregoing embodiments, persons skilled in the art should understand that they can still make modifications to the technical solutions described in the foregoing embodiments or make equivalent replacements to some or all of the technical features thereof. These modifications or replacements do not make the essence of the corresponding technical solutions deviate from the scope of the technical solutions of the embodiments of the present disclosure.

What is claimed is:

1. A light-emitting module, comprising:
  a drive substrate, wherein the drive substrate comprises a substrate and a drive layer located at a side of the substrate, the drive layer comprises thin film transistors, and the substrate is an integral structure;
  cell structures arranged in an array of m rows and n columns and located at a side of the drive layer facing away from the substrate, wherein both m and n are positive integers and m and n are not both 1, the cell structures each comprise light-emitting devices, and the cell structures are driven independently from each other; and
  drive chips, wherein one of the cell structures corresponds to at least one of the drive chips,
  wherein one of the cell structures corresponds to one group of groups of drive circuits; and
  at least one of the cell structures overlaps a partial structure of one of at least one of the drive circuits in a direction perpendicular to a plane of the substrate,
  wherein in a direction perpendicular to a plane of the substrate, at least one of the cell structures does not overlap a partial structure of one of the drive circuits that corresponds to the cell structure;
  wherein one group of the groups of drive circuits comprises a scan driving circuit and a light-emitting control circuit, and in a row direction of the cell structures, the scan driving circuit and the light-emitting control circuit are disposed at two sides of one of the cell structure that corresponds to the scan driving circuit and the light-emitting control circuit; or
  wherein one group of the groups of drive circuits comprises a scan driving circuit and a light-emitting control circuit, wherein the scan driving circuit comprises a first scan driving circuit and a second scan driving circuit, and the light-emitting control circuit comprises a first light-emitting control circuit and a second light-emitting control circuit; and in a row direction of the cell structures, the first scan driving circuit and the second scan driving circuit are disposed at two sides of one of the cell structures that corresponds to the first scan driving circuit and the second scan driving circuit, and the first light-emitting control circuit and the second light-emitting control circuit are disposed at two sides of one of the cell structures that corresponds to the first light-emitting control circuit and the second light-emitting control circuit; or
  wherein one group of the groups of drive circuits comprises a scan driving circuit and a light-emitting control circuit, and in a row direction of the cell structures, the scan driving circuit and the light-emitting control circuit are disposed at a same side of one of the cell structures that corresponds to the scan driving circuit and the light-emitting control circuit.

2. The light-emitting module according to claim 1, wherein the substrate is a glass substrate or a flexible substrate.

3. The light-emitting module according to claim 1, wherein the at least one of the drive chips, corresponding to the one of the cell structures, is located in a peripheral region of the one of the cell structures.

4. The light-emitting module according to claim 1, wherein one of the cell structures has an end in a row direction of the cell structures, which overlaps one of the drive circuits.

5. The light-emitting module according to claim 4, wherein one group of the groups of drive circuits comprises a scan driving circuit and a light-emitting control circuit, and one of the cell structures has an end in the row direction of the cell structures, which overlaps one of the scan driving circuit and the light-emitting control circuit; or
  wherein one group of the groups of drive circuits comprises a scan driving circuit and a light-emitting control circuit, and one of the cell structures has an end in the row direction of the cell structures, which overlaps both the scan driving circuit and the light-emitting control circuit.

6. The light-emitting module according to claim 1, wherein one of the cell structures has two ends arranged in a row direction of the cell structures and overlapping at least one of the drive circuits.

7. The light-emitting module according to claim 6, wherein one group of the groups of drive circuits comprises a scan driving circuit and a light-emitting control circuit, and one of the cell structures has two ends arranged in the row direction of the cell structures, wherein one of the two ends overlaps the scan driving circuit, and the other one of the two ends overlaps the light-emitting control circuit; or
  wherein one group of the groups of drive circuits comprises a scan driving circuit and a light-emitting control circuit, wherein the scan driving circuit comprises a first scan driving circuit and a second scan driving circuit, and the light-emitting control circuit comprises a first light-emitting control circuit and a second light-emitting control circuit; and one of the cell structures has two ends arranged in the row direction of the cell structures, wherein one of the two ends overlaps the first scan driving circuit and the first light-emitting control circuit, and the other one of the two ends overlaps the second scan driving circuit and the second light-emitting control circuit.

8. The light-emitting module according to claim 1, wherein n cell structures of the cell structures are arranged in a row direction of the cell structures, wherein a $p^{th}$ cell structure of the n cell structures overlaps at least one of the drive circuits that corresponds to the $p^{th}$ cell structure, where p is an integer, and $1<p<n$; or
  wherein n cell structures of the cell structures are arranged in a row direction of the cell structures, wherein a first cell structure of the n cell structures has an end arranged close to an $n^{th}$ cell structure of the cell structures and overlapping one of the drive circuits, and the $n^{th}$ cell structure has an end arranged close to the first cell structure and overlapping one of the drive circuits.

9. The light-emitting module according to claim 1, wherein a maximum distance between two adjacent light-emitting devices of the light-emitting devices within one of the cell structures in a row direction of the cell structures is Dmax; and
- a distance between two adjacent light-emitting devices that respectively located in two of the cell structures in the row direction of the cell structures is D0, wherein D0≤Dmax.

10. The light-emitting module according to claim 1, wherein one of the cell structures corresponds to one group of groups of drive circuits; and
- in at least one of the cell structures, at least two light-emitting devices of the light-emitting devices in a row direction of the cell structures are arranged in a pixel row; and a distance between a first light-emitting device of the at least two light-emitting devices and one of the at least two light-emitting device that is adjacent to the first light-emitting device in the pixel row is D1, and a distance between a last light-emitting device of the at least two light-emitting devices and one of the at least two light-emitting device that is adjacent to the last light-emitting device is D2, where D1>D2.

11. The light-emitting module according to claim 1, wherein the drive layer further comprises pixel circuits, and one of the pixel circuits corresponds to at least one of the light-emitting devices; and in at least one of the cell structures, one of the light-emitting devices has a length of L1 in a row direction of the cell structures, and one of the pixel circuits corresponding to the light-emitting device has a length of L2 in the row direction of the cell structures, where L1>L2; or
- wherein the drive layer further comprises pixel circuits, wherein one of the pixel circuits corresponds to at least one of the light-emitting devices, and the pixel circuits comprise a first pixel circuit and a second pixel circuit; in a row direction of the cell structures, the first pixel circuit has a length of L3, and the second pixel circuit has a length of L4, where L3<L4; and in one of the cell structures, at least one of the light-emitting devices is electrically connected to the first pixel circuit.

12. The light-emitting module according to claim 1, wherein one of the cell structures corresponds to one group of groups of drive circuits, and one group of the groups of drive circuits comprises a scan driving circuit and a light-emitting control circuit;
- in one of the cell structures, at least two of the light-emitting devices in a row direction of the cell structures are arranged in one of pixel rows; and
- the scan driving circuit corresponding to one of the cell structures comprises scanning shift registers that are cascaded, and one of the scanning shift registers is configured to drive at least two of the pixel rows; and/or the light-emitting control circuit corresponding to one of the cell structures comprises light-emitting shift registers that are cascaded, and one of the light-emitting shift registers is configured to drive at least two of the pixel rows.

13. The light-emitting module according to claim 1, wherein the cell structures each comprise a power supply structure connected to one of the drive chips, and the power supply structures of the cell structures are insulated from each other; or
- the cell structures each comprise a power supply structure connected to one of the drive chips, the power supply structure comprises a first metal trace and a second metal trace that are connected in parallel, and an insulating layer is provided between the first metal trace and the second metal trace; or
- the cell structures each comprise a power supply structure connected to one of the drive chips, the power supply structure comprises at least two metal layers that are stacked, and no insulating layer is provided between adjacent metal layers of the at least two metal layers.

14. The light-emitting module according to claim 1, wherein each of the cell structures comprises a drive circuit, and one of the drive chips corresponding to the cell structure is configured to control, through the drive circuit, the light-emitting devices to emit light.

15. A display apparatus, comprising:
- a light-emitting module, wherein the light-emitting module comprises:
  - a drive substrate, wherein the drive substrate comprises a substrate and a drive layer located at a side of the substrate, the drive layer comprises thin film transistors, and the substrate is an integral structure;
  - cell structures arranged in an array of m rows and n columns and located at a side of the drive layer facing away from the substrate, wherein both m and n are positive integers and m and n are not both 1, the cell structures each comprise light-emitting devices, and the cell structures are driven independently from each other; and
  - drive chips, wherein one of the cell structures corresponds to at least one of the drive chips,
- wherein one of the cell structures corresponds to one group of groups of drive circuits; and
- at least one of the cell structures overlaps a partial structure of one of at least one of the drive circuits in a direction perpendicular to a plane of the substrate,
- wherein in a direction perpendicular to a plane of the substrate, at least one of the cell structures does not overlap a partial structure of one of the drive circuits that corresponds to the cell structure;
- wherein one group of the groups of drive circuits comprises a scan driving circuit and a light-emitting control circuit, and in a row direction of the cell structures, the scan driving circuit and the light-emitting control circuit are disposed at two sides of one of the cell structure that corresponds to the scan driving circuit and the light-emitting control circuit; or
- wherein one group of the groups of drive circuits comprises a scan driving circuit and a light-emitting control circuit, wherein the scan driving circuit comprises a first scan driving circuit and a second scan driving circuit, and the light-emitting control circuit comprises a first light-emitting control circuit and a second light-emitting control circuit; and in a row direction of the cell structures, the first scan driving circuit and the second scan driving circuit are disposed at two sides of one of the cell structures that corresponds to the first scan driving circuit and the second scan driving circuit, and the first light-emitting control circuit and the second light-emitting control circuit are disposed at two sides of one of the cell structures that corresponds to the first light-emitting control circuit and the second light-emitting control circuit; or
- wherein one group of the groups of drive circuits comprises a scan driving circuit and a light-emitting control circuit, and in a row direction of the cell structures, the scan driving circuit and the light-emitting control circuit are disposed at a same side of one of the cell structures that corresponds to the scan driving circuit and the light-emitting control circuit.

16. A light-emitting module, comprising:

a drive substrate, wherein the drive substrate comprises a substrate and a drive layer located at a side of the substrate, the drive layer comprises thin film transistors, and the substrate is an integral structure;

cell structures arranged in an array of m rows and n columns and located at a side of the drive layer facing away from the substrate, wherein both m and n are positive integers and m and n are not both 1, the cell structures each comprise light-emitting devices, and the cell structures are driven independently from each other; and drive chips, wherein one of the cell structures corresponds to at least one of the drive chips, wherein one of the cell structures has two ends arranged in a row direction of the cell structures and overlapping at least one of the drive circuits, wherein one group of the groups of drive circuits comprises a scan driving circuit and a light-emitting control circuit, and one of the cell structures has two ends arranged in the row direction of the cell structures, wherein one of the two ends overlaps the scan driving circuit, and the other one of the two ends overlaps the light-emitting control circuit; or wherein one group of the groups of drive circuits comprises a scan driving circuit and a light-emitting control circuit, wherein the scan driving circuit comprises a first scan driving circuit and a second scan driving circuit, and the light-emitting control circuit comprises a first light-emitting control circuit and a second light-emitting control circuit; and one of the cell structures has two ends arranged in the row direction of the cell structures, wherein one of the two ends overlaps the first scan driving circuit and the first light-emitting control circuit, and the other one of the two ends overlaps the second scan driving circuit and the second light-emitting control circuit.

17. A light-emitting module, comprising:

a drive substrate, wherein the drive substrate comprises a substrate and a drive layer located at a side of the substrate, the drive layer comprises thin film transistors, and the substrate is an integral structure;

cell structures arranged in an array of m rows and n columns and located at a side of the drive layer facing away from the substrate, wherein both m and n are positive integers and m and n are not both 1, the cell structures each comprise light-emitting devices, and the cell structures are driven independently from each other; and drive chips, wherein one of the cell structures corresponds to at least one of the drive chips, wherein one of the cell structures corresponds to one group of groups of drive circuits; and in at least one of the cell structures, at least two light-emitting devices of the light-emitting devices in a row direction of the cell structures are arranged in a pixel row; and a distance between a first light-emitting device of the at least two light-emitting devices and one of the at least two light-emitting device that is adjacent to the first light-emitting device in the pixel row is D1, and a distance between a last light-emitting device of the at least two light-emitting devices and one of the at least two light-emitting device that is adjacent to the last light-emitting device is D2, where D1>D2.

* * * * *